US011398365B1

(12) United States Patent
Own

(10) Patent No.: US 11,398,365 B1
(45) Date of Patent: Jul. 26, 2022

(54) POSITIONING SAMPLES FOR MICROSCOPY, INSPECTION, OR ANALYSIS

(71) Applicant: Mochii, Inc., Seattle, WA (US)

(72) Inventor: Christopher Su-Yan Own, Seattle, WA (US)

(73) Assignee: Mochii, Inc., Seattle, WA (US)

( * ) Notice: Subject to any disclaimer, the term of this patent is extended or adjusted under 35 U.S.C. 154(b) by 0 days.

(21) Appl. No.: 16/355,704

(22) Filed: Mar. 15, 2019

Related U.S. Application Data

(60) Provisional application No. 62/643,534, filed on Mar. 15, 2018.

(51) Int. Cl.
| H01J 37/20 | (2006.01) |
| H01J 37/26 | (2006.01) |
| H01J 37/22 | (2006.01) |
| H01J 37/244 | (2006.01) |
| H01J 37/147 | (2006.01) |

(52) U.S. Cl.
CPC .......... H01J 37/20 (2013.01); H01J 37/1472 (2013.01); H01J 37/222 (2013.01); H01J 37/244 (2013.01); H01J 37/26 (2013.01); H01J 2237/184 (2013.01); H01J 2237/201 (2013.01); H01J 2237/202 (2013.01); H01J 2237/204 (2013.01);
(Continued)

(58) Field of Classification Search
CPC .... H01J 37/20; H01J 37/26; H01J 2237/2007; H01J 2237/201; H01J 2237/202; H01J 2237/204
See application file for complete search history.

(56) References Cited

U.S. PATENT DOCUMENTS

2013/0014528 A1*   1/2013   Stabacinskiene ..........................
                                                G01N 23/20033
                                                           62/129
2015/0137000 A1*   5/2015   Naruse ................... H01J 37/20
                                                           250/441.11
(Continued)

FOREIGN PATENT DOCUMENTS

JP            H06-176729 A   *   6/1994   ............ H01J 37/141

OTHER PUBLICATIONS

Own, C.S., et al., "First Nucleotide Sequence Data from an Electron Microscopy Based DNA Sequencer," Microsc. Microanal. 19 (Suppl 2), 2013.

(Continued)

Primary Examiner — Eliza W Osenbaugh-Stewart
(74) Attorney, Agent, or Firm — Nienstadt PLLC

(57) ABSTRACT

An apparatus is provided for microscopy, inspection, or analysis of a sample. The apparatus has a vacuum chamber and a charged-particle beam column in the vacuum chamber to direct a charged-particle beam onto a sample. The charged-particle beam column includes a charged-particle beam source to generate a charged-particle beam and charged-particle beam optics to direct the charged-particle beam onto the sample. The apparatus has a detector to detect radiation emanating from the sample to generate an image. A cartridge is provided to support the sample in the path of the charged-particle beam in the vacuum chamber. The cartridge is mechanically decoupled from the environment external to the vacuum chamber. A controller is provided to analyze the detected radiation to generate an image of the sample.

22 Claims, 10 Drawing Sheets

(52) U.S. Cl.
CPC .......... *H01J 2237/2007* (2013.01); *H01J 2237/2802* (2013.01)

(56) References Cited

U.S. PATENT DOCUMENTS

| | | | |
|---|---|---|---|
| 2015/0206706 A1* | 7/2015 | Man | H01J 37/20 250/307 |
| 2019/0287759 A1* | 9/2019 | Own | H01J 37/244 |

OTHER PUBLICATIONS

Payne, A.C., et al., "Molecular Threading: Mechanical Extraction, Stretching and Placement of DNA Molecules from a Liquid-Air Interface," PLoS ONE 8(7): e69058.

* cited by examiner

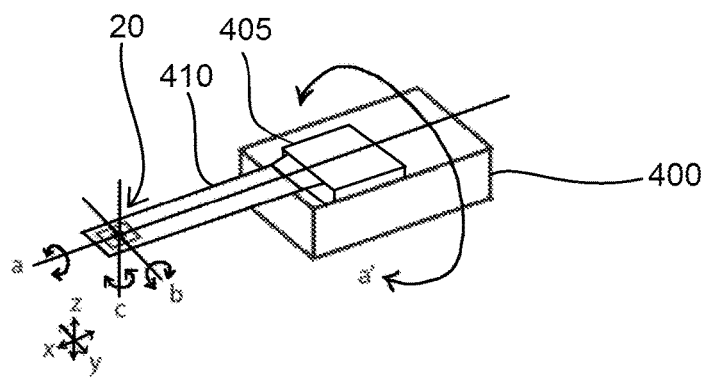
Fig. 5
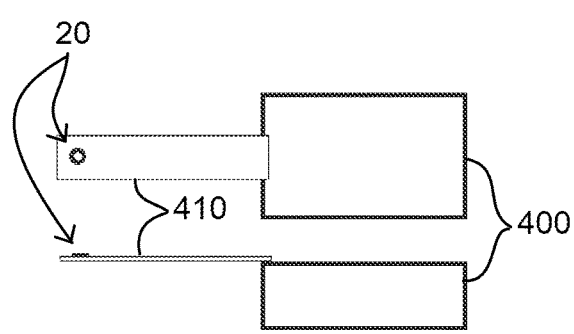    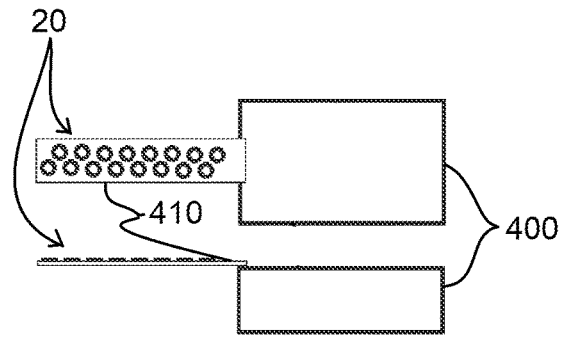
Fig. 6A                Fig. 6B

POSITIONING SAMPLES FOR MICROSCOPY, INSPECTION, OR ANALYSIS

CLAIM FOR PRIORITY

This application claims priority under 35 U.S.C. § 119(e) to Provisional Application 62/643,534, filed Mar. 15, 2018, which is incorporated herein by reference in its entirety.

TECHNICAL FIELD

This application relates to positioning samples for microscopy, inspection, or analysis.

BACKGROUND

Apparatuses for microscopy, inspection, or analysis of a sample typically require the sample to be held in an observation area, such as inside a controlled vacuum. For example, charged-particle beam microscopy, such as electron microscopy and focused ion beam microscopy, can be used to image samples at very small dimensions, such as to inspect samples at dimensions smaller than what is possible using solely light microscopy. Charged-particle beam microscopy may also reveal information that is not readily available through light microscopy, such as in relation to composition, crystallography, and topography of the sample.

However, such apparatuses may suffer from mechanical, thermal, and/or electromagnetic interference from the outside environment that affects the quality of imaging or inspection. For example, such apparatuses may have imprecision or instabilities in the positioning of the sample during observation.

Furthermore, apparatuses that have an observation area inside a vacuum chamber typically have a number of practical disadvantages in terms of speed and cost when numerous samples are to be observed sequentially. For example, sequential imaging of multiple samples in a charged-particle beam microscope may require frequent vacuum-pumping cycles and recurring human manual intervention to insert samples.

Thus, it is desirable to apparatuses for microscopy, inspection, or analysis of a sample that are not as susceptible to mechanical, thermal, and/or electromagnetic interference from the outside environment. It is also desirable to provide charged-particle beam microscopy that can image numerous samples at relatively high speed and low cost.

SUMMARY

In one embodiment, an apparatus is provided for microscopy, inspection, or analysis of a sample. The apparatus comprises a vacuum chamber and a charged-particle beam column in the vacuum chamber to direct a charged-particle beam onto a sample. The charged-particle beam column comprises a charged-particle beam source to generate a charged-particle beam and charged-particle beam optics to direct the charged-particle beam onto the sample. The apparatus comprises a detector is provided to detect radiation emanating from the sample to generate an image. A cartridge is provided to support the sample in the path of the charged-particle beam in the vacuum chamber, the cartridge being mechanically decoupled from the environment external to the vacuum chamber. A controller is provided to analyze the detected radiation to generate an image of the sample.

It is to be understood that both the foregoing general description and the following detailed description are exemplary and explanatory only and are not restrictive of the invention as claimed.

BRIEF DESCRIPTION OF THE DRAWINGS

The accompanying drawings, which are incorporated in and constitute a part of this specification, illustrate several embodiments and aspects of the transmission electron microscopes described herein and, together with the description, serve to explain the principles of the invention.

FIG. 5 illustrates a perspective view of an example of an embodiment of a cartridge holding a sample stick with a carrier and a sample on the carrier.

FIG. 6A illustrates top and side views of an example of an embodiment of a cartridge holding a sample stick with a single sample on the sample stick.

FIG. 6B illustrates top and side views of an example of an embodiment of a cartridge holding a sample stick having multiple samples arranged in an array on the sample stick.

DETAILED DESCRIPTION

Apparatuses for microscopy, inspection, or analysis of a sample may be used to observe a sample at small dimensions. For example, a charged-particle beam microscope—such as a transmission electron microscope (TEM), scanning electron microscope (SEM), scanning transmission electron microscope (STEM), or focused ion beam (FIB) microscope—may be adapted and used advantageously to image and analyze samples at very small dimensions. Such a microscope may illuminate the sample with one or more charged-particle beams (such as electron beams) and detect radiation from the sample to generate an image of the sample. A TEM, for example, converges an electron beam into a "field of view" on the sample to image that field. A SEM or STEM, meanwhile, scans an electron beam that is formed into a probe across the sample to generate an image pixel-by-pixel. The images may be evaluated, such as by a human user of the microscope or automatically, to identify characteristics of the sample.

Figure 1:
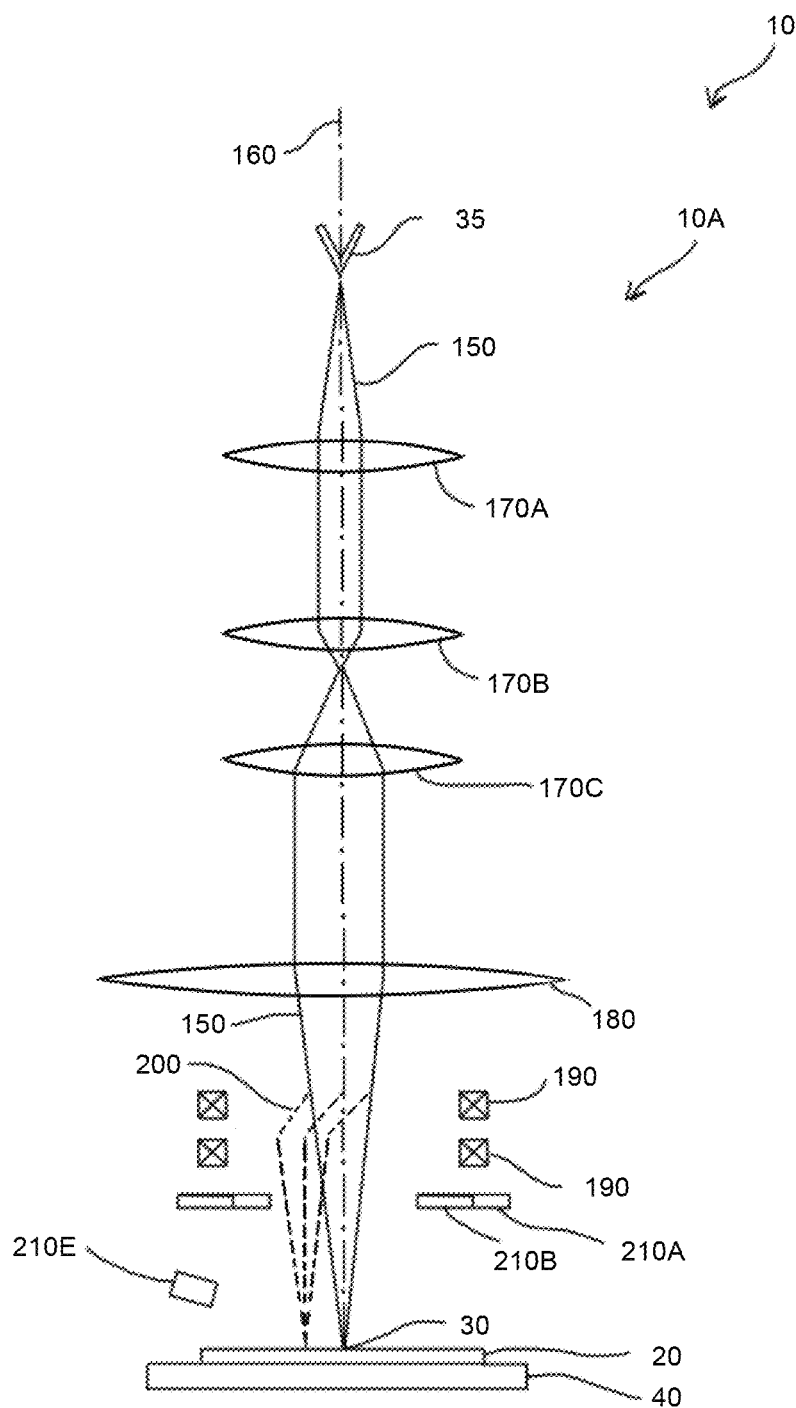
FIG. 1 is a schematic diagram of an example of an embodiment of a scanning electron microscope (SEM).

FIG. 1 is a schematic diagram of one example of an embodiment of a microscope 10 that is a SEM 10A, provided for the sake of illustration. SEM 10A has a housing that, when closed, is substantially airtight and defines a chamber with an enclosed volume therein. A sample 20 can be placed inside SEM 10A, such that an area that can be exposed to an electron beam probe 30 for imaging. Sample 20 may include and be supported, for example, by a substrate (not shown). Sample 20 may be of any quantity, may be of any suitable shape or size, and may include any desired features. For example, sample 20 may include a specific configuration for a desired application or parameter setting. In another embodiment, discussed in further detail below, sample 20 is a reference (or "test") sample used for testing or optimization purposes, such as containing gold nanoparticles. The substrate that can be used to support sample 20 may include a layer of crystalline or amorphous carbon. Single-atomic-layer graphene may also be used. Alternatively or in addition, the substrate may include boron nitride, silicon, silicon dioxide, aluminum, polymeric resins, or organic materials.

SEM 10A may have a stage 40 to support and move sample 20 within SEM 10A. Stage 40 may be adapted to move sample 20 in one (e.g., "x-axis"), two (e.g., "x- and y-axes"), or three dimensions (e.g., "x-, y-, and z-axes"), and/or to tilt sample 20 (e.g., "α" and/or "β"). This stage movement can allow imaging of different regions of sample 20 (i.e., "x- and y-axes"), forward or backward positioning of sample 20 along the axis of the electron beam (i.e., "z-axis") to achieve different imaging characteristics, and imaging of sample 20 from different incidence angles (i.e., "α" and/or "β").

SEM 10A further includes an electron beam source 35 to generate an electron beam 150. Electron beam source 35 may be adapted to generate an electron beam having a current of less than about 100 mA. For example, for many applications electron beam source 35 may generate a beam current of from about 10 picoamps to about 1 milliamp. In an especially low-current version, however, electron beam source 35 may be adapted to generate electron beam 150 to have a current of less than about 10 μA, such as less than about 10 pA. Electron beam source 35 may have a filament (e.g., tungsten filament) through which current is passed to generate electrons and a Wehnelt to channel the electrons into a beam. Further, electron beam source 35 may have an accelerating aperture to accelerate the electron beam away from electron beam source 35.

SEM 10A has an optical system through which electron beam 150 travels from source 35 to sample 20, and optionally through which electron beam 150 travels after it has been transmitted through sample 20. The optical system may define an optic axis 160 along which electron beam 150 travels. The optical system may include illumination optics. The illumination optics may include condenser lenses 170A-C to form electron beam 150 into a collimated probe 30 that illuminates sample 20. Condenser lenses 170A-C may consist of, for example, two, three (as shown in the figure), or four lenses. Condenser lenses 170A-C may be magnetic or electrostatic.

The optical system of SEM 10A may also include an objective lens 180 to focus electron beam 150. An objective aperture may be provided in the back focal plane of objective lens 100 or a plane conjugate to the back focal plane to define an acceptance angle, referring to an angle of electron beam 150 that is transmitted through the aperture and allowed to illuminate sample 20. The rays that objective lens 100 focuses to probe 30 on sample 20 are thus limited in angle by the aperture.

One or more beam scanners 190 may be provided to scan electron beam 150 across sample 20. FIG. 1 shows an example of a scanned beam 200 at a second position. Beam scanners 190 may scan electron beam 150 by generating either a magnetic or an electric field. For example, beam scanners 190 may include scan coils that generate an alternating magnetic field. Alternatively, beam scanners 190 may use electrostatic deflectors to scan electron beam 150. Beam scanners 190 may be provided in pairs, such as two or four paired electromagnetic coils or electrostatic deflectors. Beam scanners 190 can be excited with ramp waveforms, causing the collimated probe to be scanned across the sample and thereby producing an intensity signal at the detector unique to the location of the probe on the sample. FIG. 1 shows an example of electron beam 150 being scanned between a first position and a second position 200.

In one version, beam scanners 190 are adapted to provide a larger field of view compared to conventional charged-particle beam microscopes. For example, beam scanners 190 may include double-rocking scan coils, coils with a greater turns ratio, or higher-power (i.e., higher-current) scan coils. Alternatively or in addition to scan coils, beam scanners 190 may include electrostatic deflectors that can slew greater voltages, such as voltages greater than about 15 V. These embodiments can increase the size of the field of view of the microscope. Large field-of-view beam scanners such as those described above may advantageously be used in combination with a long-working-distance optical column to enhance the efficacy of the optical column by enabling larger areas to be surveyed in one image without translation of the sample or multiple images being taken and later montaged.

When sample 20 is illuminated by electron beam 150, electrons interact with sample 20, producing radiation that emerges from the sample surface in a pattern that is collected by one or more detectors 210A, 210B. Detectors 210A, 210B may detect radiation that can include one or more of backscattered electrons, secondary electrons, auger electrons, cathodoluminescence, ionized gas, and x-rays, and generate a corresponding signal.

The electron-beam energy used in SEM 10A may be selected at least in part based on the target resolution, the transmission properties of sample 20, and the energy of the detected radiation. The penetration depth of the beam into sample 20 may be selected to permit the escape and detection of interaction radiation from sample 20. The penetration depth may be selected to be, for example, from about 1 nanometer to several micrometers, such as, for example, a penetration depth on the order of 2 nanometers, to result in a range of sensitivities to surface or subsurface structure.

If electrons of electron beam are reflected or deflected from sample 20, they are considered scattered. For example, electrons scattered back toward the electron-beam source are referred to as backscattered. In one example, backscattered electrons can be successfully detected if they have an energy of at least about 2 keV. As a result, electrons having an energy of from about 2 keV to about 3 keV may have the lowest beam energy appropriate to permit detection of backscatter electrons in this example, unless a backscatter detector of low-energy type is used, in which case backscattered electrons with energies of less than about 1 keV may be detected. Secondary electrons, on the other hand, are produced by secondary processes at sample 20 and may possess far lower energies of, for example, from a few Volts to a few hundred Volts. Thus, the detection of secondary electrons may be compatible with lower beam energies. Lower beam energies have advantages in certain problem spaces, which may include being less destructive to samples, less deeply penetrating (i.e., more surface-sensitive), and requiring lower-cost equipment to generate and stabilize the accelerating potential.

Detectors 210A, 210B may detect charged particles, such as scattered electron beams, emerging from sample 20 at one or more angles. Each of detectors 210A, 210B may comprise, for example, a scintillator and a photosensitive detector. The photosensitive detector may be, for example, a charge-coupled device (CCD). The scintillator produces photons when impacted by charged particles. The photosensitive detector receives that light and outputs a corresponding electrical signal.

The intensity and/or angle of scattered electrons may vary according to the atomic number (Z) of atoms in sample 20. For example, a greater number of electrons may be backscattered and produce a higher-intensity signal at detectors 210A, 210B when atoms of higher atomic number are illuminated. In one embodiment, atoms of sample 20 having higher atomic number scatter electrons to higher angles, while lighter atoms scatter electrons to lower angles, revealing information about the composition of sample 20.

Detectors that are photosensitive may be provided to detect light-emitting phenomena such as cathodoluminescence or fluorescence. These may be the same detectors as or different detectors than the charged-particle-sensitive detectors such as detectors 210A, 210B. For example, a charged-particle-sensitive detector that is made of a scintillator and a photosensitive detector may have a scintillator that is substantially optically transparent, such that photons pass through the scintillator and are detected by the same photosensitive detector.

A photosensitive detector of microscope 10 may even be adapted to be sensitive to particular preselected wavelengths. For example, an array of multiple detectors with varying spectral sensitivity may be provided. Photons within a tight spectral window may be detected by a silicon photomultiplier (SiPM) that amplifies their signal into an electrical signal. Alternatively, a multi-spectrum or broad spectrum SiPM may detect these photons such that photons of multiple preselected wavelengths within a wider range may be detected simultaneously.

In one version, charged-particle-sensitive detectors are configured in one or more concentric annular rings and a central circular disc detector in an approximately cylindrically symmetric detector arrangement to receive the electrons (as shown in FIG. 1). There may be apertures between detectors 210A, 210B. For each range of angles, detectors 210A, 210B may provide an intensity signal corresponding to current received for that angular range. If the detector is a CCD, the scattered beams may form an image of a diffraction pattern or channeling pattern of sample 20.

Alternatively to concentric, on-axis detectors, the detectors may have a shape that is cylindrically asymmetric. For example, the detectors may be segmented or configured as area detectors that are arranged off-axis. In other embodiments, the detectors have an inner or outer perimeter that is polygonal, such as square or hexagonal, or another suitable shape.

Figure 2:
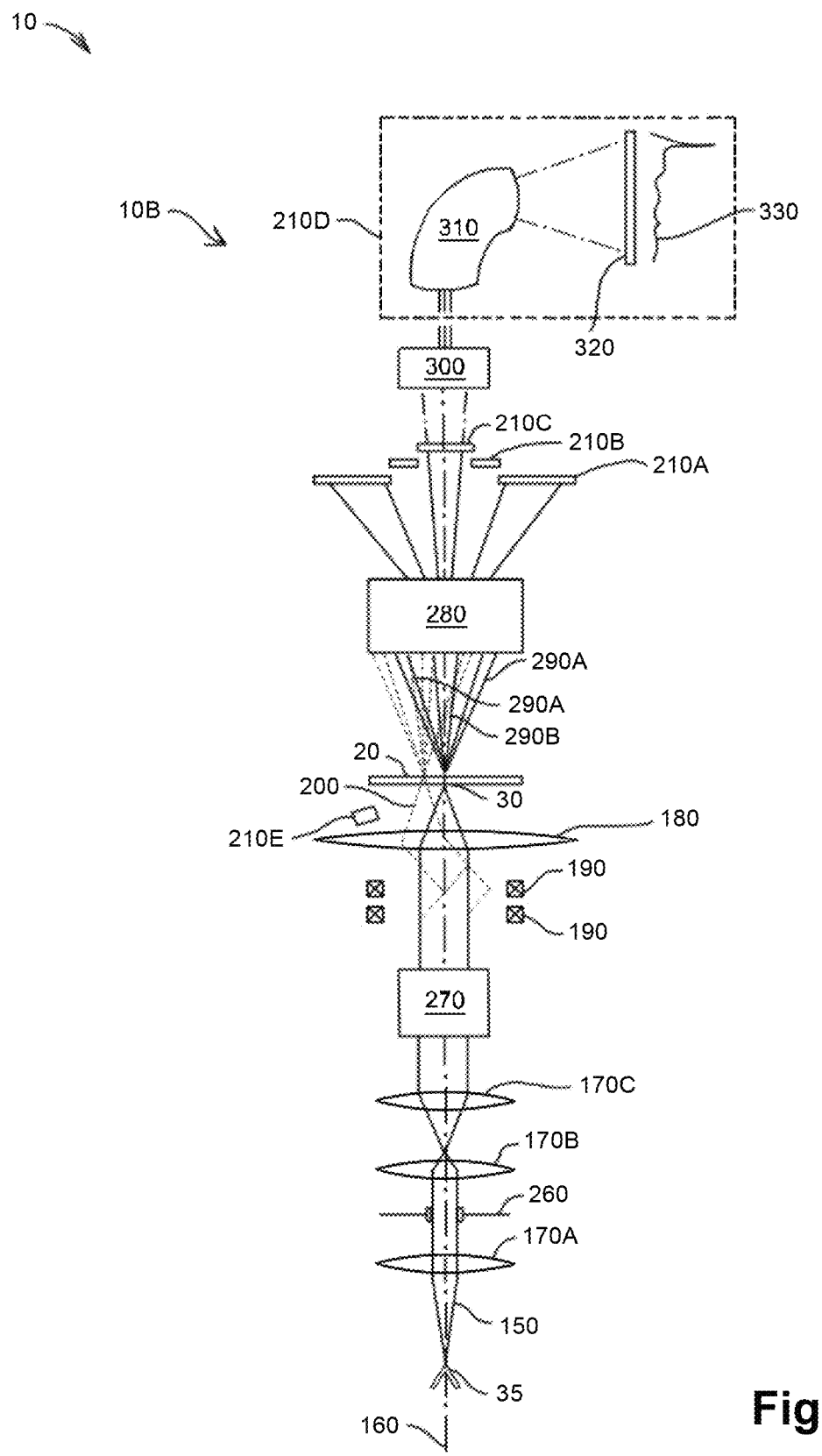
FIG. 2 is a schematic diagram of an exemplary embodiment of a scanning transmission electron microscope (STEM).

FIG. 2 is a schematic diagram of another exemplary embodiment of microscope 10, which in this case is a STEM 10B, provided for the sake of illustration. In the STEM mode, the scattered beam is at least partially transmitted through sample 20 and this portion is therefore considered forward scattered. STEM 10B, like SEM 10A, may have a stage (not shown), electron beam source 35, illumination optics 170A, 170B, 170C, aperture 260, objective lens 100, beam scanners 190, and detectors 210A-C, 210E.

In order to improve speed, accuracy, and sensitivity, STEM 10B may have a dedicated aberration corrector 270 to correct for aberrations in electron beam 150, such as spherical aberrations and parasitic aberrations. The parasitic aberrations may or may not be cylindrically symmetric. Aberration corrector 270 may include electromagnetic lenses to correct for these aberrations. Parasitic aberrations may be caused, for example, by the optical elements having been machined in such a way as to be very slightly off-axis or very slightly non-round. Examples of commercially available aberration correctors include Nion Co. quadrupole-octupole correctors (available from Nion Company of Kirkland, Wash.) and CEOS sextupole or quadrupole-octupole correctors (available from Corrected Electron Optical Systems GmbH of Heidelberg, Germany).

The optical system of STEM 10B may also include descanning and projection optics 280. The descanning optics may de-scan scattered electron beams 290A, 290B, thus, for example, realigning beam 290B with optic axis 160. The descanning optics may comprise, for example, descanning coils that may be symmetric to scan coils of beam scanners 190. The projection optics may include magnifying lenses that allow additional manipulation of scattered electron beams 290A, 290B.

The electron beam energy used in STEM 10B may be determined at least in part based on the transmission properties of sample 20. A substrate of sample 20 may have a thickness on the order of 2 nanometers, such as for example a thickness of about 1 nanometer. In one example, the substrate is made of carbon, although single-atomic-layer graphene may also be used. As a result, 1 keV electrons may be the lowest energy appropriate when considering voltage alone.

STEM 10B may be adapted to operate in a "bright field" mode in which a detector, such as detector 210C, detects a "forward-scattered" or "central" beam 290B of electrons emerging from specimen 20. Forward-scattered beam 290B refers to the zero beam (i.e., the 0 scattering vector, referring to the beam whose direction is identical to the orientation of beam 150 impinging on specimen 20) and a small range of angles around the zero beam. The bright-field mode may be particularly sensitive to the energy loss of the electrons, indicating chemical composition. These electrons can be detected to determine, for example, bonding energies of molecules that compose the sample.

Alternative to the bright-field mode, STEM 10B may be adapted to operate in a dark-field mode in which one or more electron beams 290A emerging from sample 20 within a particular angular range are detected. Since sample 20 is illuminated at approximately a point, this angular range of detection can be tightly controlled. For example, the dark-field mode may be an annular-dark-field (ADF) mode in which an electron beam shaped as a hollow cone of preselected thickness is detected. The dark-field mode may involve detecting a hollow cone at higher angles, which is referred to as high-angle annular-dark-field (HAADF) mode. The dark-field mode may also be a medium-angle dark-field (MADF) mode, in which a range of angles between the bright-field mode and the HAADF mode are detected. These dark-field modes can produce an image with monotonic contrast change with increasing atomic number, which enables direct interpretability of the image to determine relative atomic weights. For example, dark-field imaging can be used to obtain chemically sensitive projections of single atoms, clusters of atoms, or nanostructures. STEM 10B can also operate in simultaneous bright-field and dark-field modes. An electron beam source having a high-brightness gun may allow this mode to operate faster.

In one version, STEM 10B may have a detector 210D adapted to detect electrons in one or more preselected range of energies. Coupling optics 300 may be provided and detector 210D may include an electron prism 310 to filter out electrons that are not in the preselected energy ranges. In one version, this is used for electron energy loss spectroscopy (EELS). Electron prism 310 may, for example, generate an electric or magnetic field by using electrostatic or magnetic means, respectively. The field strength and dimensions of electron prism 310 may be selected such that, when the electrons of varying energies pass through the field, the electrons in the preselected energy range are transmitted through electron prism 310 while the remaining electrons are blocked. Detector 210D may also include a receiver 320, such as including a scintillator and CCD, to receive the transmitted electrons and convert that current into a detection signal. The EELS detection signal can be expressed as a plot 330 of current as a function of electron energy loss.

Furthermore, optics having a larger acceptance angle may improve resolution of STEM 10B. Because of this relationship between the acceptance angle and resolution of STEM 10B, the acceptance angle can be selected based on the desired resolution. For example, in a high-resolution STEM, if 1 Angstrom resolution at 100 kilovolts is desired, it may be desirable to have at least about 30 milliradians acceptance half-angle, or even at least about 40 milliradians acceptance half-angle. However, with an angular range that is unnecessarily high, current may be wasted undesirably. Once a suitable accelerating voltage is chosen, the desired resolution may determine the acceptance angle of objective lens 180.

Moreover, detectors 210A-E from SEM and STEM embodiments, such as, for example, from FIGS. 1 and 2, respectively, may be provided concurrently in one embodiment of microscope 10. These may be provided, for example, to operate microscope 10 in simultaneous SEM and STEM modes or to allow relatively quick and easy switching between SEM and STEM modes.

The geometry of one or more of detectors 210A-C may be adapted to distinguish low-angle scattering from high-angle scattering in both forward and backscattering configurations to make contrast in the image depend on atomic number (Z). Detectors 210A-C may be located on the same side of sample 20 as electron beam source 35 or opposite to it. For example, in a STEM mode, detector 210A may be provided to operate in a HAADF mode in which high-angle electron beam 210A is detected, detector 210B may operate in a MADF mode, and detector 210C may operate in a bright-field mode in which axial electron beam 210B including a zero beam is detected.

Each of detectors 210A, 210B, if arranged in a substantially cylindrically symmetric geometry, may limit the scattered electrons to an angular range denoted here as $\varphi_d$, which defines an annulus between an inner angle $\varphi_1$ and outer angle $\varphi_2$. For an ADF mode these angles may be, for example, from about 25 mrad to about 60 mrad for $\varphi_1$, and from about 60 mrad to about 80 mrad for $\varphi_2$. For a STEM HAADF mode using detector 210A, these angles may be, for example, from about 60 mrad to about 80 mrad for $\varphi_1$, and greater than about 100 mrad for $\varphi_2$.

The optical system of a beam-optical microscope (i.e., charged-particle beam microscope, such as a TEM, SEM, or STEM) may be referred to as the optical "column."

Figure 3:
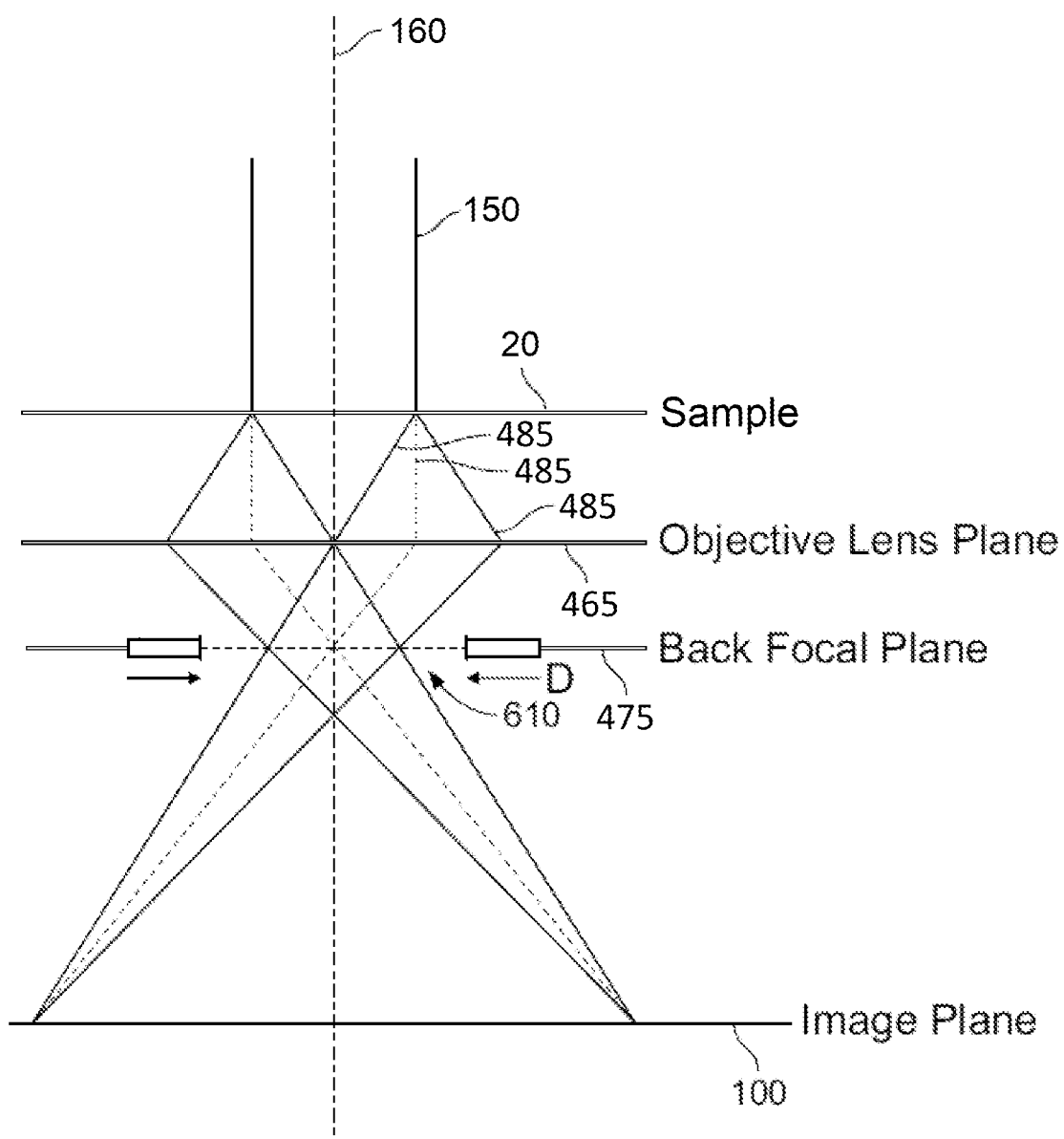
FIG. 3 is a schematic diagram of an exemplary embodiment of a TEM.

FIG. 3 is a schematic side view of another example of an embodiment of a transmission electron microscope (TEM). Illuminating electron beam 150 is provided parallel to optic axis 160 and onto sample 20. Beams scattered from sample 20 are collected by the objective lens in objective lens plane 465, which focuses the beams onto image plane 100. In back focal plane 475 of the objective lens, a diffraction pattern is formed that is the Fourier transform of the exit waveform of sample 20, representing angles of scatter from sample 20. Three scattered beams 485 are shown demonstrating that rays scattered to the same angle by different points on sample 20 converge to specific points in back focal plane 475 representative of their scattering angle. In projection, the three points correspond to scattering vectors g, 0 (forward-scattered), and –g. The "forward-scattered beam" refers to the zero beam (i.e., the 0 scattering vector) and a small range of angles around the zero beam.

Electrostatic optical components may enhance imaging or observation of magnetic samples. This is in addition to the advantage of being able to use a single supply to power all lens elements. Trim lenses may be used for as "fine" focusing to modify the "coarse" focus of the primary lenses such as the objective lens. The coarse focus lens may have a fixed focus. Alternatively, the column may be operated as a fixed-focus lens, where focusing is performed by altering the position of the sample relative to the optical components of the column.

An electrostatic trim lens can also be used within the system to provide fine focusing. Because it offers trim, it may be operated at one to two orders of magnitude lower potential than the primary lens potentials. This trim lens may take the form of a single aperture with a potential applied, or may be a more formal lens such as a full Einzel lens that is weakly excited. A variation of the above-described embodiment uses one or more magnetic lenses.

The optical column may be constructed as a module that is enclosed and adapted to be inserted and locked into the microscope enclosure and removed therefrom by a human user. The microscope housing may complementarily be adapted to receive the column module. Both the column module and the microscope housing may be adapted to permit signal communication between the column module and other components of the microscope when the column module is locked into the microscope.

The column module may contain components of a charged-particle optical column, such as but not limited to the charged-particle beam source. Optical elements, such as lenses, shape the beam as it propagates through the column. The components may also include, for example, an accelerating aperture (such as a first anode), a stigmator, beam scanners to scan the beam, and detectors. Sidewalls of the enclosure may be made of an electrical insulator in one embodiment. The top of the enclosure, meanwhile, may be metal.

The column module may be substantially sealed from an environment external to the column. For example, when evacuated, the column module may maintain a significant pressure difference between the volume inside the column module and the external environment. The internal volume and the external environment may even have different species of gases or liquid.

The column module may have a feedthrough that allows electrical signals to be conducted through enclosure and into the column module, such that signals may be applied to the components inside the column module. For example, electric potentials may be applied, through the feedthrough, independently to the gun of the charged-particle beam source and the optical components. The feedthrough may have electrical leads with exposed electrical contacts that couple to electrical contacts of the microscope housing when the column module is inserted and locked into microscope 10. As an alternative to electrical signals, the feedthrough may be adapted to convey optical signals, such as through optical fibers embedded in the feedthrough.

In one version, a full TEM column is modularized such that the entire optical stack and optionally the detector and sample region are contained within a single module. Several modules may be easily interchangeable and replaceable. A housing may contain the column module, which attaches to the housing via a single interconnect to a feedthrough. Optionally an orifice or multiple orifices for sample introduction and/or loading may be part of the housing. The feedthrough may contain electrical and/or vacuum connections. This method of single interconnection has, as an advantage, that a single column may be switched easily with another, enabling rapid servicing and use of the housing for a different column for substantially continuous use.

Additional optical components, such as lenses, stigmators, deflectors, beam splitters, and prisms may be implemented as respective modules to augment the functioning of the system. Such elements may allow for capabilities such as beam blanking, interferometry, holography, and other types of unique measurements by affecting the beam shape or geometry just above the sample.

Other examples of microscopes are described in U.S. patent application Ser. No. 15/899,349, filed Feb. 19, 2018, to Own et al., and U.S. Pat. No. 8,921,787, issued Dec. 30, 2014, to Own et al., which are incorporated herein by reference in their entireties.

Microscope 10 may include or be connected to a power supply that provides power to components of microscope 10. The power supply may include one or more individual power supplies, such as set to different voltages or otherwise taking different forms. Components of a charged-particle beam microscope that receive power from the power supply may, for example, include a charged-particle beam source (e.g., electron beam source 35), condenser lenses (e.g., condenser lenses 170A, 170B, 170C), the objective lens (e.g., objective lens 180), the detectors (e.g., detectors 210A-E), and the stage (e.g., stage 40). The power supply also provides power to the pumps of microscope 10, and to any other components of microscope 10 that consume power. In one embodiment of a charged-particle beam microscope, the optical system of microscope 10 has a total power consumption for all such components of less than about 2.5 kW. In another embodiment, designed for power efficiency, microscope 10 is a charged-particle beam microscope that has a total power consumption of less than about 1 kW. In yet another embodiment optimized for very high efficiency, microscope 10 is a charged-particle beam microscope that has a total power consumption of less than about 100 W.

In a charged-particle beam microscope, the power supply can provide one or more voltages to accelerate the charged-particle beam. In one version, the power supply includes at least one high-voltage supply, which may be used for a number of lenses. A single high-voltage supply that may be used to provide the primary beam energy can be modified with resistors to provide multiple values to different lenses that are at a ratio of the primary high-voltage value of the high-voltage supply. These resistors may be either constant or programmable (such as by the controller described below). In this manner, instabilities that may be present in the high voltage signal can be provided substantially equally to the multiple lenses and the effects of the instabilities can be lessened. The power supply may also include one or more low-voltage supplies, such as to provide lower voltages to non-round lenses, such as dipoles, quadrupoles, and octupoles.

Charged-particle beam microscope 10 may include a controller to control various aspects of operation of microscope 10. The controller may, for example, receive inputs from a human user, provide instructions or other signals to components of microscope 10, and/or perform data processing of signals detected by microscope 10 to generate and process images. For example, the controller may control the components of the optical column of microscope 10, such as, in the case of a charged-particle beam microscope, the charged-particle beam source, beam scanners (e.g., beam scanners 170), and the detectors, as well as the stage (e.g., stage 40). As another example, the controller may control and/or read back data from the power supply for the charged-particle beam source filament by transmitting and receiving control commands and data. The controller may also receive signals from the detectors (such as detectors 190A-E) to be processed computationally to generate images. The controller may include an image formation unit for this purpose. The image formation unit may be disposed within or external to the microscope column and communicate with the optical system and the stage in any fashion, such as by a direct or indirect electronic coupling, or via a network. The controller may automatically handle one or more aspects of operation of microscope 10, and may even be adapted to substantially automate the operation of microscope 10 with minimal input required from a human user.

The controller may include one or more microprocessors, controllers, processing systems, and/or circuitry, or any suitable combination of hardware and/or software modules. For example, the controller may be implemented in any quantity of personal computers, such as IBM-compatible, Apple, Macintosh, Android, or other computer platforms. The controller may also include any commercially available operating system software, such as Windows, OS/2, Unix, or Linux, and any commercially available and/or custom software such as communications software or microscope monitoring software. Furthermore, the controller may include one or more types of input devices, such as for example a touchpad, keyboard, mouse, microphone, or voice recognition.

The controller software may be stored on a computer-readable medium, such as a magnetic, optical, magneto-optic, or flash medium, floppy diskettes, CD-ROM, DVD, or other memory devices, for use on stand-alone systems or systems connected by a network or other communications medium, and/or may be downloaded, such as in the form of carrier waves, or packets, to systems via a network or other communications medium.

The apparatus for microscopy, inspection, or analysis may have a cartridge 400 to support and precisely move one or more samples 20 in the observation area. Cartridge 400 may contain one or more actuators 405, such as motors, that are disposed inside or nearer the imaging area (e.g., within the vacuum chamber) than with conventional sample stages. In one version, cartridge 400 is adapted to hold a sample stick 410 that supports one or more samples 20.

Figure 4:
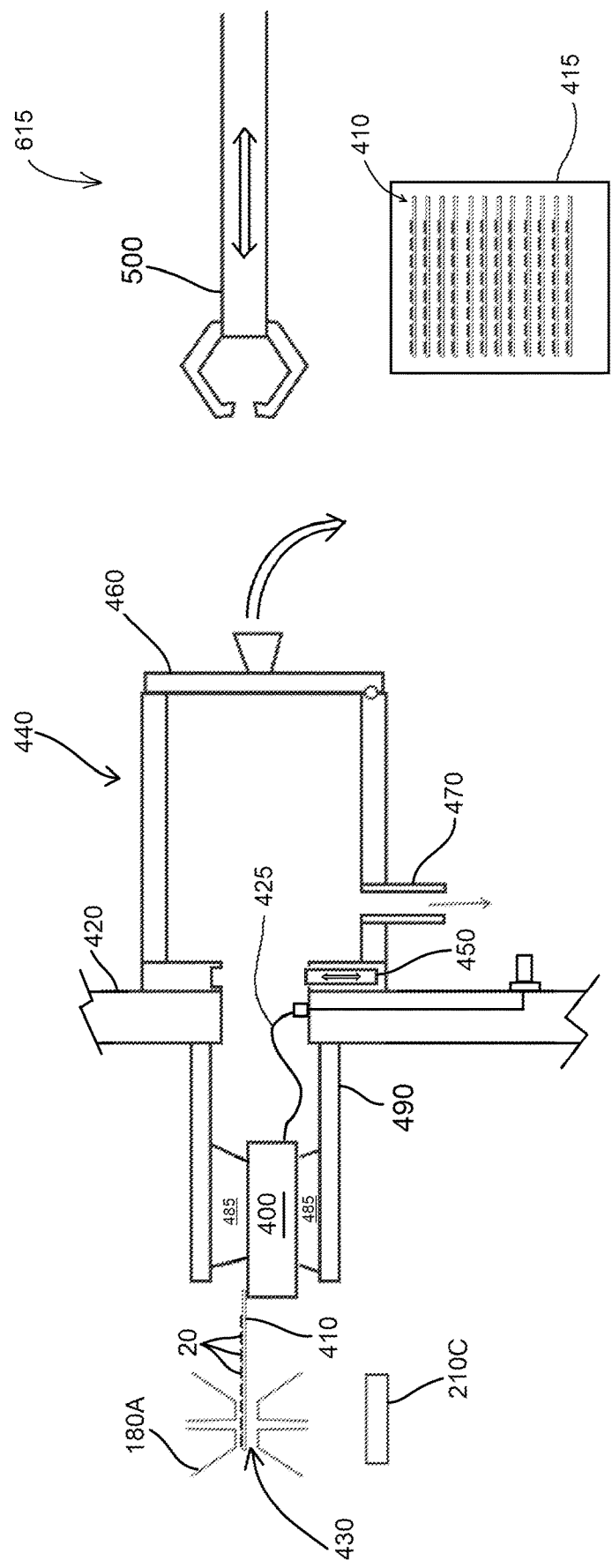
FIG. 4 illustrates a schematic side view of an example of an embodiment of a charged-particle beam microscope having an airlock that permits cartridges to be inserted into the vacuum chamber and to move samples in the observation area.

FIG. 4 illustrates a schematic side view of an example of an embodiment of a charged-particle beam microscope and a cartridge 400 that is inserted into vacuum chamber 420 and to move samples 20 in the observation area 430. Cartridge 400 may implement aforementioned stage 40, such as on cartridge 400 itself or on a sample stick held by cartridge 400.

Cartridge 400 may impart motion to sample 20 in multiple directions, which may include linear and rotational directions. For example, in one embodiment, illustrated in FIG. 5, cartridge 400 provides motion in 'x' and 'y' directions. Additionally, however, cartridge 400 may provide motion of sample 20 in one or more of the 'z' direction and one, two, or three rotational directions, as shown in FIG. 5.

The localization of the actuators inside or near observation area 430 (e.g., within the vacuum chamber) may reduce lossy or unstable linkages and/or interferences. Losses in mechanical linkages can include, for example, hysteresis in a linkage, an imprecision from necessary clearances in a rotary shaft linkage, or an inelastic deformation of a lever. Instabilities can include, for example, sensitivity to a vibration that is amplified through a lever of a linkage or resonances in a complex linkage.

Actuators 405 of cartridge 400 may be configured to impart motions to sample 20 by movements in actuators 405 that are on the same or a substantially similar order of magnitude as the sample movements. Similar orders of magnitude in this context may be, for example, less than or equal to two or three orders of magnitude. In contrast, a conventional stage may attempt a reduction in the order of magnitude of motions of about four or seven.

The actuators may include stick-slip, piezo walker, or vibratory motors based on piezos or micro-actuators. For example, the motors may include one or more piezoelectric motors that are capable of moving the stage very quickly and smoothly so that short exposures on the order of milliseconds or microseconds can be practically achieved. The piezoelectric motors may also be adapted to move sample 20 with very high positional precision. The actuators may alternatively include, for example, voice coils.

It may also be advantageous to mechanically decouple cartridge 400 from the environment outside vacuum chamber 420 to improve mechanical isolation of sample 20 from instabilities originating outside vacuum chamber 420. In conventional apparatuses, it may be inefficient and imprecise to produce small motions of the sample inside or near observation area 430 by originating motions substantially distant from observation area 430. Such small motions may be on the order of nanometers or smaller. In the case of a TEM or STEM, "distant" may refer to, for example, a distance of at least about 20 cm.

Cartridge 400 may additionally improve thermal isolation of the sample motions from outside observation area 430. Thermal modulations can cause, for example, expansions and/or contractions of materials that unpredictably affect sample positioning and therefore imaging quality.

Further, cartridge 400 may improve electromagnetic isolation of the sample motions. For example, stepper motors for a sample stage may generate electromagnetic interference that could adversely affect charged-particle beam 150. The improved electromagnetic isolation may therefore advantageously improve the tolerance of the imaging system to a stepper motor drive circuit that may be operating with an electromagnetically noisy type of signal such as pulse-width modulation (PWM).

Cartridge 400 may be shaped and sized to be inserted into vacuum chamber 420 through an opening of limited size. For example, although cartridge 400 may contain multiple actuators to provide motion in a plurality of dimensions, cartridge 400 may be adapted to be substantially compact in form factor. In one embodiment, cartridge 400 is smaller than 10 cm×10 cm×10 cm.

An airlock 440 may be provided to allow venting to air without requiring venting of vacuum chamber 420. Airlock 440 may therefore permit the removal and insertion of cartridges 400 in relation to vacuum chamber 420 without necessitating venting of vacuum chamber 420. Airlock 440 may include one or more valves 450 to selectively isolate the atmosphere inside airlock 440 from the atmosphere inside vacuum chamber 420. Airlock 440 may also have a door 460 that can be opened to allow access to the interior of airlock 440 and can be closed before vacuum pumping the interior of airlock 440. Airlock 440 may further have a pumping outlet 470, and may have a dedicated vacuum pump, to allow evacuation of the atmosphere inside airlock 440. For example, in one embodiment airlock 440 can have a speed of vacuum cycling of less than about 10 minutes. Cartridge 400, or even just sample stick 410, can be inserted or removed while maintaining the vacuum in vacuum chamber 420.

The combination of insertable cartridge 400 and airlock 440 may significantly reduce or eliminate overhead associated with sample exchange and/or transfer, sample positioning, and related user interventions.

An anchor 485 may be provided to support cartridge 400 inside vacuum chamber 420. Anchor 485 may be configured to be substantially stable in relation to the observation area 430, such as objective lens polepiece 180A. Mechanical stability of anchor 485 may include, for example, positional and thermal stability. In one embodiment, anchor 485 is rigidly attached to the frame of the apparatus, such as attached to a wall of vacuum chamber 420 directly or by a support structure 490. In another embodiment, such as in a TEM or STEM, anchor 485 may be rigidly coupled to a polepiece 180A of objective lens 180. Meanwhile, anchor 485 may be decoupled from the environment external to vacuum chamber 420. Anchor 485 may hold cartridge 400 by, for example, complementary frictional elements on the anchor and cartridge.

A transfer arm 500 may be provided to transfer cartridge 400, or even just sample stick 410, between airlock 440 and vacuum chamber 420, and/or between the external environment and airlock 440. Transfer arm 500 may be operated manually or robotically, such as automatically. Transfer arm 500 may use, for example, a screw retention mechanism, a clamping or gripping mechanism, or a magnetic or electromagnetic grabber to attach itself to cartridge 400 for movement of cartridge 400, or to sample stick 410 for movement of sample stick 410. Transfer arm 500 may also have gripping fingers, which may be actuated by gears, pulleys, or any other suitable mechanism. Cartridge 400 may have an attachment region that is substantially robust to contact with transfer arm 500 for secure attachment of transfer arm 500 during movement.

Cartridge 400 may be communicatively coupled to the environment outside of vacuum chamber 420 for signal transmission and/or reception across the vacuum-retaining wall. The signals may be transmitted electrically or optically. For example, the signals may be transmitted from outside of vacuum chamber 420, such as from the controller, to the actuators of cartridge 400. Additionally, signals may be transmitted from cartridge 400 to outside of vacuum chamber 420, such as to provide feedback about cartridge 400. In one example, a microencoder provides feedback to the controller about the actuated position of cartridge 400.

In one version, cartridge 400 may be communicatively coupled to outside of vacuum chamber 420 by fine, highly flexible electrical wires 425. These may include, for example, one or more stranded multi-filar conductors of a gauge thinner than, e.g., 28 AWG. Electrical wires 425 may be bundled and/or shielded.

In another version, cartridge 400 may be communicatively coupled to outside of vacuum chamber 420 by electromagnetic transmission, such as radio or optical transmission. For example, the transmission may be implemented using Wi-Fi or Bluetooth protocols.

With reference to FIGS. 6A, 6B, 7A, and 7B, each of sample sticks 410 may support one sample 20 or multiple discrete samples 20. Sample sticks 410 may be made of a suitable material, such as, for example, aluminum or semiconductor. For example, sample sticks 410 may be a monolithic silicon wafer containing a plurality of samples and corresponding viewing windows. Further, each of sample sticks 410 may support sample(s) 20 on a carrier 510, such as a semiconductor puck.

FIG. 6A illustrates top and side views of an example of an embodiment of a cartridge 400 holding a sample stick 410 with a single sample 20 on the sample stick 410. FIG. 6B illustrates top and side views of an example of an embodiment of a cartridge 400 holding a sample stick 410 having multiple samples 20 arranged in an array on the sample stick 410.

Figure 7A:
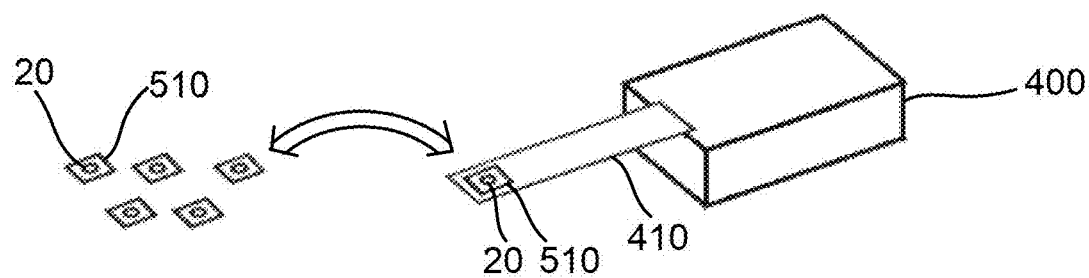
FIG. 7A illustrates a perspective view of an example of an embodiment of a cartridge holding a sample stick with a carrier and a sample on the carrier, alongside multiple carriers, each having a sample, that may be swapped for the carrier on the sample stick.
Figure 7B:
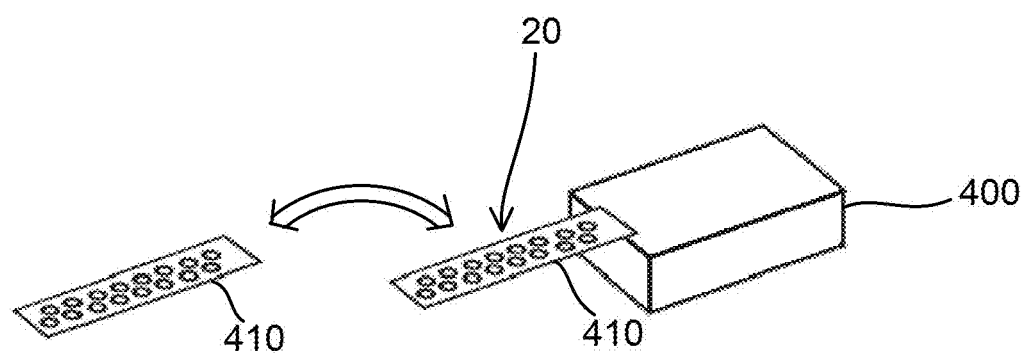
FIG. 7B illustrates a perspective view of an example of an embodiment of a cartridge holding a sample stick with multiple samples, alongside another sample stick with multiple samples that may be swapped for the sample stick being held by the cartridge.

FIG. 7A illustrates a perspective view of an example of an embodiment of a cartridge 400 holding a sample stick 410 with a carrier 510 and a sample 20 on the carrier 510, alongside multiple carriers 510, each having a sample 20, that may be swapped for the carrier 510 on the sample stick 410. FIG. 7B illustrates a perspective view of an example of an embodiment of a cartridge holding a sample stick with multiple samples, alongside another sample stick with multiple samples that may be swapped for the sample stick being held by the cartridge.

Sample sticks 410 may be swapped automatically, such as from a magazine 415 of sample sticks 410. For example, cartridge arm 500 may be implemented to swap sample sticks 410 in the apparatus.

In yet another version, a tape may be provided as a carrier medium for samples to be imaged. When a tape system is used, cartridge 400 may be configured to guide the tape into the observation area. The tape may be made of a flexible continuous material with suitable thermal isolation and damping properties. Examples of materials that may be suitable for use in the vacuum environment of EM include, for example, polyimide, neoprene, and Viton®. The tape may be coated with a conductive or moderately resistive film or impregnated with conductive particles to ensure electrical conductivity and to carry away excess charge.

A reel-to-reel tape system may be provided to transport such flexible tape, or some other medium, across observation area 430 of the apparatus. The apparatus could be a TEM or STEM, for example. The observation area could be a small aperture in a cartridge that holds the tape such that a sample can be analyzed and enables the tape to progress so that subsequent samples can be analyzed. The samples may be created in a different preparation step and placed onto the tape for analyzing. Examples of reel-to-reel tape systems are described in U.S. patent application Ser. No. 15/339,922, filed Oct. 31, 2016, to Own et al., which is incorporated herein by reference in its entirety.

Charged-particle beam microscope 10 can be controlled using at least one terminal having a user interface (UI) that communicates with microscope 10, such as via the controller. Either all or a subset of the functionality of each component may be exposed to the UI, such as via an application programming interface (API). The UI may automatically make changes to the components based on information it receives from the user, from other components, and/or at certain times or locations. The UI may thereby offer a simplified way to control various components of microscope 10.

Microscope 10 may be operated by a portable device providing that UI in the form of hardware and/or software. The portable device may be, for example, a tablet computer, smartphone, or other consumer device. For example, this UI may be a secondary interface, where a terminal that is local to microscope 10 constitutes the primary interface. This secondary interface can provide some or all of the functionality of the primary user interface, such as complete operation of microscope 10. Any number of these secondary interfaces may be adapted to control the instrument.

The UI may include a touch-screen interface to enhance interaction of the user with the microscope. For example, a pinching movement of the fingers or hand on the touchscreen may cause the image to grow or shrink. Dragging with a finger could cause the stage to move. It may also shift the current image immediately, estimating the appearance of the next image to acquire. Other gestures could perform other operations (e.g., two-finger drag could change astigmatism, etc.) The user could use a touch screen interface to perform all necessary actions on the microscope. These could include moving the sample, changing the field of view, focusing, stigmating, or otherwise tuning the image, changing the sample dwell time, changing the resolution, changing source intensity, etc. The UI may also be configured to synchronize and mediate between multiple devices connected to microscope 10.

The controller and the UI may provide two-way communication between the human user and microscope 10, such as feedback-based control of microscope 10 by the user. For example, the user may make a gesture at the UI, such as a swipe of a finger, that causes a stage movement or beam displacement to shift imaging in proportion to the swipe. The UI may then quickly refresh the image provided to the user for the new imaging location. The user may also make a gesture at the UI to change, for example, one or more imaging perspectives, brightness, or contrast, which may control detectors of the microscope, such as by turning them on or off or by triggering actuators that change the detectors' positions. For feedback-based control of microscope 10, it may be desirable to have two-way communications between UI and microscope 10 with suitably low latency in relation to human visual and tactile senses, and at least one-way communication from microscope 10 to UI with sufficiently high throughput to provide images to the user sufficiently quickly to give the user a sense of "real time" performance. In one embodiment, lower-resolution survey images may be provided to the user in substantially real time, and at a selected imaging location the user may request a higher resolution image that is not provided in real time. In one example, microscope 10 and the UI are adapted to have the stage respond to user commands with a latency of less than about 100 ms. In another example, microscope 10 and the UI are adapted to respond to user commands and give feedback or send a complete image from microscope 10 to the UI in less than about 1,000 ms, and preferably less than 500 ms.

Figure 8:
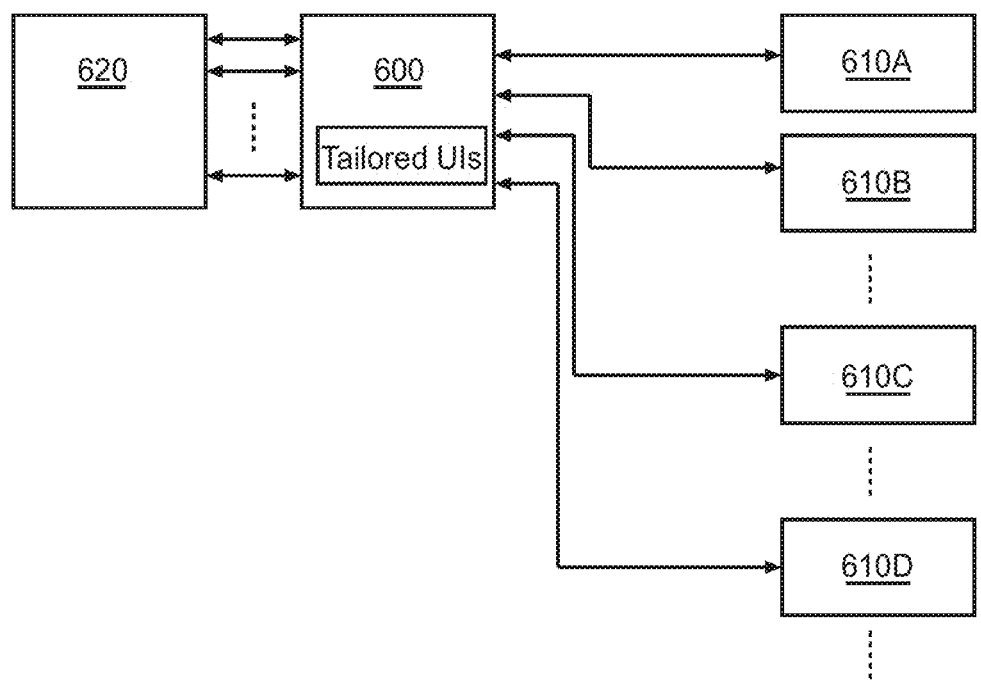
FIG. 8 is a schematic diagram of communications between microscope hardware, a controller, and multiple clients.

FIG. 8 is a schematic diagram of an example of an embodiment in which a controller 600 serves multiple clients 610A-D. Clients 610A-D may serve as terminals having UIs. Controller 600 is connected to microscope hardware 620, which may include, for example, the optical components, detectors, stage, and power supply of the microscope. Controller 600 can thereby control the microscope and/or read back data or other signals from the microscope. Controller 600 may serve tailored UIs, which are customized for one or more of particular types of clients 610A-D. For example, controller 600 may include a web server that provides tailored UIs to clients 610A-D as web services, which may be exposed and served based on authentication, identification, or some other request method from client. This can allow two-way communication between controller 600 and clients 610A-D. Clients 610A-D may include simple clients, such as, for example, imaging monitors, as well as complex clients, such as, for example, microscope controllers, image postprocessors, cloud storage or processing services, or microscope managers.

The controller and the UI may be adapted to attempt to perform as many operations automatically as possible. For example, starting an application, or turning the device on may be interpreted as the user wanting to operate the microscope and it can attempt to turn on the microscope automatically. This could also happen in response to actions taken on the instrument itself; e.g., closing a door could interpreted as a cue to turn on the microscope. The microscope may be kept as "on" as possible, depending on power requirements or longevity of components.

As one example, automation may be provided around the changing of a sample in a charged-particle beam microscope (EM). Changing the sample may, in some embodiments, require venting to air a previously evacuated area, and may involve ramping the source voltage down to a safe level. Both steps may be performed automatically when the user starts the sample change. Once the change is complete the area is automatically evacuated and the high voltage automatically turns on. (If the instrument is running on batteries, however, this step may be postponed until later to preserve battery power.) The microscope would automatically get itself as ready as possible for imaging, for example ramping the filament to a temperature at which its lifetime is not shortened, but it remains near enough to the operating temperature that normal operation can be achieved relatively quickly without any stress to the filament. At this point the user could start the tablet computer, smartphone, or other consumer device, or even visit a website, at which point the microscope is automatically turned on fully (if running under batteries, this could be the point at which it performs the previous steps mentioned, having postponed preparation of the microscope for imaging until needed to preserve battery life).

Once the user has indicated that the imaging session is over, which could be either via a preprogrammed time limit, period of inaction or by closing an application, leaving a website, putting a device to sleep, or a suitable alternative method, the microscope returns to a "ready" state where the filament longevity is not reduced but the microscope is ready to start at a moment's notice. An example of the "ready" state may include leaving the high voltage energized and stable while turning the filament to a reduced current level to protect its longevity. If running under battery power, the microscope may skip this state and return to its minimum power state as soon as possible.

At some other point the microscope could enter its power off state, if for example an off button was pushed or an option in the software selected or some other indication that the microscope needed to power down. This could even be having the mains power removed from the microscope. At this point the microscope would safely shutdown any remaining components.

Sequential insertion, imaging, and removal of samples 20 in the observation section may be substantially or completely automated. An automated sample-feeder 615 may be provided to deliver samples to, and/or remove samples from observation area 430 of the apparatus. For example, automated sample-feeder 615 may transfer the samples between the interior of vacuum chamber 420 and an external storage unit. Automated sample-feeder 615 may additionally or alternatively include a track or belt conveyor for moving cartridge 400 from interior of airlock 440 to anchor 485. The storage section of automated sample-feeder 615 may store samples that are not currently being analyzed. For example, the storage unit may include a magazine 415 for storing an array of sample sticks 410.

For example, the controller may control transfer arm 500 as well as components of the microscope. The controller may execute a custom process, which may be made up of smaller sub-processes. These sub-processes may include, for example, monitoring the automated sample-feeder and the apparatus, performing other actions at certain times and/or conditions, interacting with other external and/or internal processes (e.g., starting, stopping, or checking statuses), and changing properties in the apparatus (e.g., sending a command to another system, setting a voltage on a TTL or CMOS signal, sending a response to a request, setting an event). Multiple processes may be combined into one, and any individual process may itself be composed of smaller processes.

As processes are executed, the controller may monitor them to gauge the status (or "health") of the microscope system. For example, the measurements can be evaluated periodically to determine whether system performance is varying over long and short timescales. Processes may be monitored in many ways, including determining how long the processes take, what outputs they produce, and what inputs they are given. The results of the process monitoring can be presented in simple, concise fashion (e.g., accessible graphs on website, raw text files, or log files). Regular reports from the system monitoring can be automatically prepared and distributed. For example, such reports could be published on website, or emailed to specified parties.

Limits can be defined at the controller for acceptable values for any monitored variable. If the acceptable range is exceeded, reports detailing the event can be automatically distributed (e.g., website, email, text message, or log message). Reports can be sent immediately or else at specified intervals with a summary of all reports during that interval.

The health monitoring process can perform actions such as (i) checking whether the pressure in the analysis section of the microscope is within sensible limits, and (ii) checking whether the tape tension is within acceptable limits. If any of these, or other, values are outside predetermined limits, actions such as notifying users (either directly/email etc.), logging to a file or emailing a set of addresses can be performed.

Using the framework described above it is possible for processes to interact with internal and external systems in a very connected way. For example, it is possible to add actions at any stage in a process that set a TTL pin low or high (or send data on a port, set a global event, etc.). This could be used to synchronize processes with an external system, for example a camera exposure triggering system. In this manner complex procedures can occur in parallel synchronized with each other.

In a conventional microscope system, exchanging samples typically comes with multiple costs. These costs include the time to exchange the sample, the difficulty of registering previously-analyzed locations on the same or similar samples loaded at different times, the need to track separate indexed samples, the risk for loss or damage during sample load/unload and storage operations, and changes in local environment (e.g., pumping down air to vacuum in electron microscopy). In some cases (e.g., large samples) the microscope must even be opened and closed, incurring an even larger time penalty.

These disadvantages can be eliminated or mitigated when samples are sequentially loaded and independently indexed using cartridge 400 and airlock 440 and/or sample sticks 410 containing multiple samples 20. Further, indexing of samples 20 can be made simple, and entire volumes may be tracked simply and efficiently.

An automated sample-feeder for a charged-particle beam microscope may be advantageous in various scenarios. For example, the automated sample-feeder may make analysis of large numbers of samples of the same type, such as in a quality control (QC) application, practical through charged-particle beam microscopy. In another example, the automated sample-feeder may assist in analysis of a continuous process that evolves in time or space. In yet another example, the automated sample-feeder may enable efficient analysis of different locations of a large structure, such as, for example, contiguous slices of brain tissue. Such analyses may be carried out sequentially and systematically, or, alternatively, at nonsequential or random locations.

Charged-particle beam microscope 10 may have a characteristic area at the plane of sample 20 in which certain imaging characteristics, such as, for example, resolution or other optical characteristics, are selected to be within a range suited to the imaging that is performed. This area may be referred to as the "field of view" of microscope 10 for certain versions. Within the field of view, the charged-particle beam may be scanned in one or more scanning areas across sample 20 while remaining within the desired range of optical characteristics (such as high resolution). For a charged-particle beam, the scanning may be performed by moving stage 40, and potentially also by electronic shifting of the beam, such as by generating an electric or magnetic field.

In one embodiment, stage 40 is adapted to be moved continuously while the charged-particle beam is simultaneously scanned. Such a continuously-moving stage may improve throughput by allowing continuous acquisition of images while eliminating the settling time caused by stop-start motion of a stage that is moved discretely and that may prevent acquisition of a still image of the sample.

Within each field of view, microscope 10 may define one or more scanning areas of sample 20 (i.e., areas in which a charged-particle beam will be scanned) contribute to the final image. Microscope 10 may perform the imaging of sample 20 in one or more cycles corresponding to the scanning areas, each imaging cycle for a scanning area yielding a contribution that is referred to here as a sub-image. Each scanning area may be noncontiguous, contiguous, or overlapping in relation to scanning areas within the same field of view or scanning areas in different fields of view. Moreover, the scanning areas may even be a combination of noncontiguous (i.e., with edges separated by a space), contiguous (i.e., edge to edge), or overlapping.

The controller may stitch together the sub-images to produce a partially or wholly comprehensive image of sample 20. For example, where there are overlapping or contiguous sub-images, these sub-images may be joined together to yield merged image data that is continuous across the corresponding scanning areas. For overlapping sub-images, the controller may use the redundant image information at the overlap to accurately join the sub-images together into a comprehensive image. The controller may automatically control the acquisition of sub-images along a set path, for example a raster pattern or a zig-zag pattern. Further, new data may automatically be integrated into a large map (e.g., a map of substantially the whole sample) as sub-images are acquired so as to fill in the large map with available information.

In one version, microscope 10 is a TEM that is configured with one or more beam scanners for combination stage-beam rastering within, and between, "supertiles." This TEM may be configured to shift the field of view of the charged-particle beam across a sample one or more times between consecutive stage movements. Between stage movements, the beam scanners may generate a magnetic and/or electric field to scan the electron beam from field to field. When all fields of view within a "supertile" have been imaged, the stage is moved to image the next "supertile." Such combination stage-beam rastering across "supertiles" may allow the acquisition and analysis of large areas of samples to be performed quickly and reliably as compared to a conventional stage-only rastering TEM.

Figure 9:
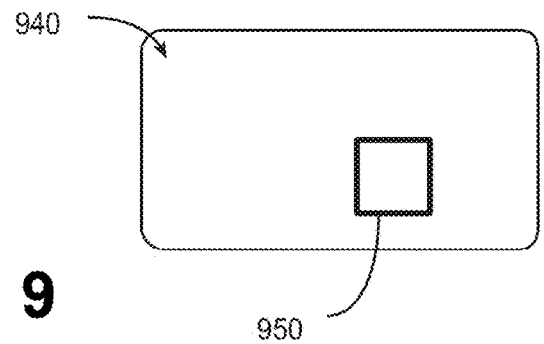
FIGS. 9, 10, 11, 12, and 13 are schematic diagrams of top views of fields of view of a TEM on a sample area of interest.

FIG. 9 is a schematic top view showing an example of an area 940 of a sample that is desired to be imaged as well as a field of view 950 of a TEM. As shown, field of view 950 may be a fraction of sample area 940. The field of view of a TEM is typically limited by the parameters of desired magnification of the image, physical detector size, and detector pixel array size. Together these parameters constrict the maximum field of view and also the ultimate resolution of the image acquired from the detector, despite the fact that the optical system may be able to form an image larger than this field of view at full microscope resolution. This field of view limits the maximum acquisition rate and increases the amount of required overlap pixels (which are subsequently discarded after being used for tile registration) for tiled acquisition of extremely large sample areas. In one example, for the sake of illustration, the field of view may have a width or diameter of about 16 µm.

Figure 10:
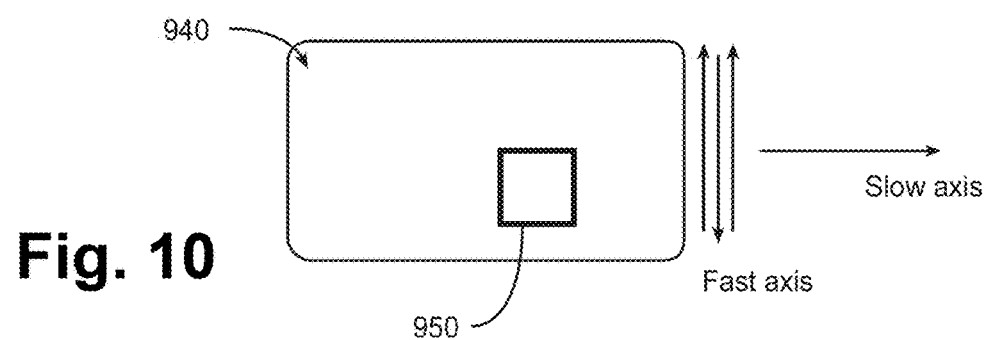
Figure 11:
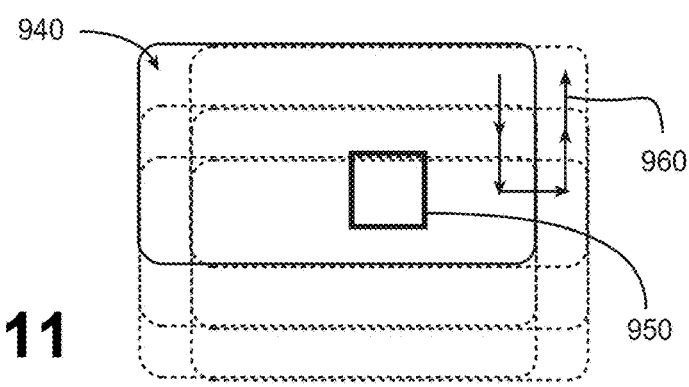

FIG. 10 is a schematic top view of an example of same sample area 940 and field of view 950, showing how field of view 950 can be shifted relative to sample area 940 by movement of the stage that holds the sample. FIG. 11 is a schematic top view showing an example of a step path 960 of the sample that is traversed by five consecutive displacements of the stage holding the sample in relation to the electron beam. In raster scanning, one scanning axis may be referred to as the "fast" axis while an orthogonal axis is referred to as the "slow" axis. For example, a shift along the "slow" axis may be performed only after all shifts have been performed in a raster line along the "fast" axis. In the example shown, the controller moves the stage two times downward along the fast axis, one time rightward along the slow axis, and then two times upward along the fast axis.

Figure 12:
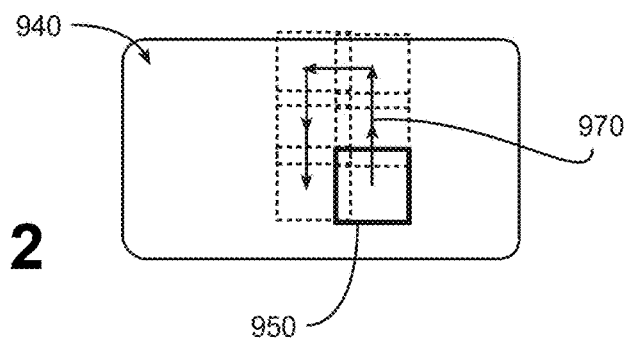

FIG. 12 is a schematic top view of an example of same sample area 940 and field of view 950, showing how field of view 950 may alternatively be shifted relative to sample area 940 by scanning the electron beam along a step path 970 without stage movement. In this example, the controller shifts the electron beam two times upward along the fast axis, one time leftward along the slow axis, and then two times downward along the fast axis.

Figure 13:
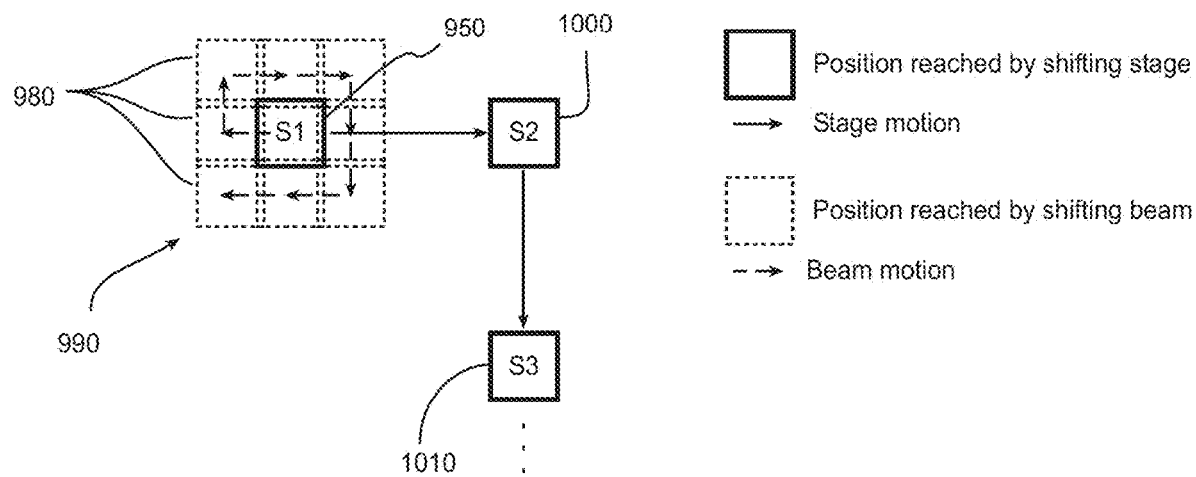

FIG. 13 is a schematic top view of an example of a field of view 950 and neighboring fields of view 980 within different fields of view, which are within range of beam scanning without stage movement. All of these nine fields of view 950, 980 may be collectively referred to as a "supertile" 990. In the example shown, the electron beam is initially positioned at central field of view 950. Next, the electron beam is shifted leftward to another field of view 980. Then, the electron beam is shifted in a clockwise pattern to each in a sequence of subsequent fields of view 980. In this example, after supertile 990 has been imaged, movement to the central field of view 1000 in a next supertile is accomplished by stage movement. And this repeats for yet another supertile 1010, and so on. Along each axis, the number of mechanical stage motions is reduced by a factor that is the number of supertile sub-images acquired along that axis; correspondingly the total number of mechanical stage motions is reduced by the square of the supertile sub-image count in the case of square supertiles.

Figure 14:
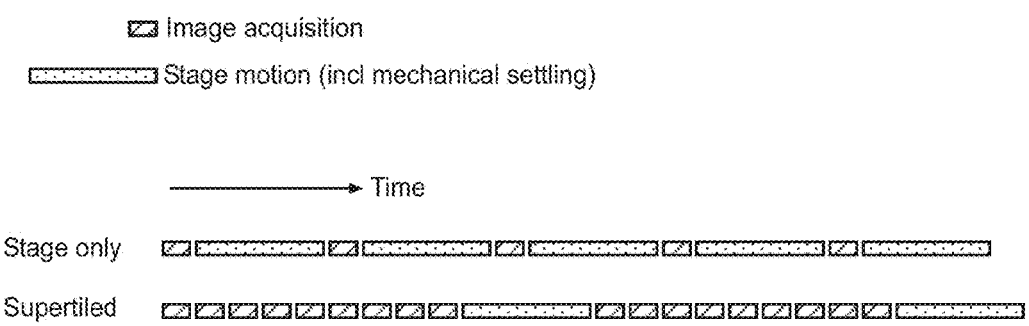
FIG. 14 is a schematic timeline of an example of a comparison between how time is used in a conventional stage-only rastering and how time is used in combination stage-beam rastering.

FIG. 14 is an illustration of timelines of an example of a comparison between how time is used in a conventional stage-only rastering and how time is used in combination stage-beam rastering. The time for stage movement may include not just the rough displacement of the stage itself but additionally the time for positional settling of the stage after each movement. As shown in this figure, "supertiling" through stage-beam rastering can provide several consecutive imaging cycles (of different sub-images) between stage movements, resulting in significantly faster imaging than through stage-only rastering.

The reduction in time to set up for imaging and substantial elimination of delay between shifts across consecutive fields of view, through beam scanning rather than stage movement, may result in per-pixel acquisition that is one or more orders of magnitude faster than in a conventional TEM. In one embodiment, for example, a microscope that has an automated combination stage-beam rastering configuration may be able to acquire images at data rates at least four orders of magnitude faster than conventional instruments. For example, imaging may be performed by a microscope column faster than about 0.1 Mpixel/s (megapixels per second).

Figure 15A:
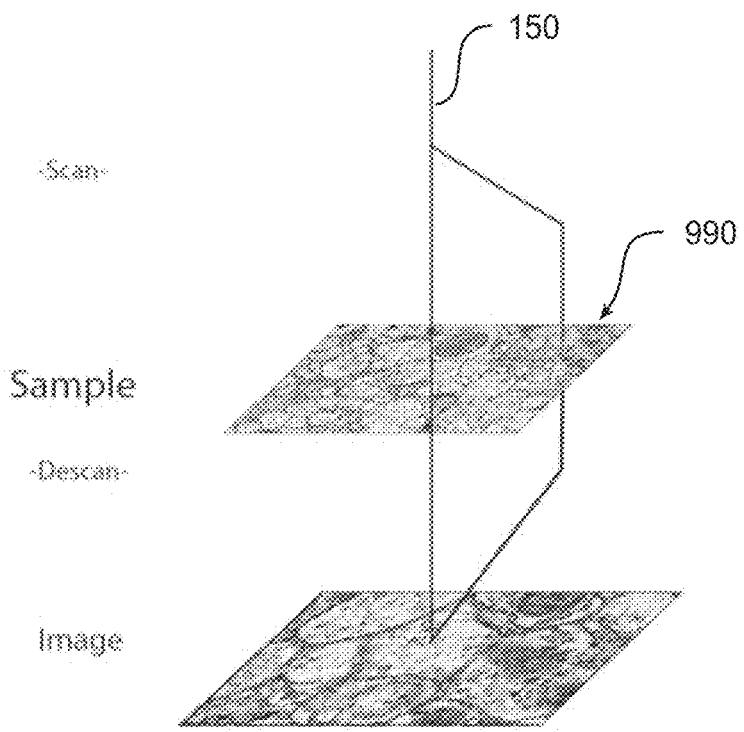
FIGS. 15A and 15B are grayscale illustrations of an example of an embodiment of scanning a nine-field supertile by an electron beam as part of combination stage-beam rastering of a cortical tissue section sample.
Figure 15B:
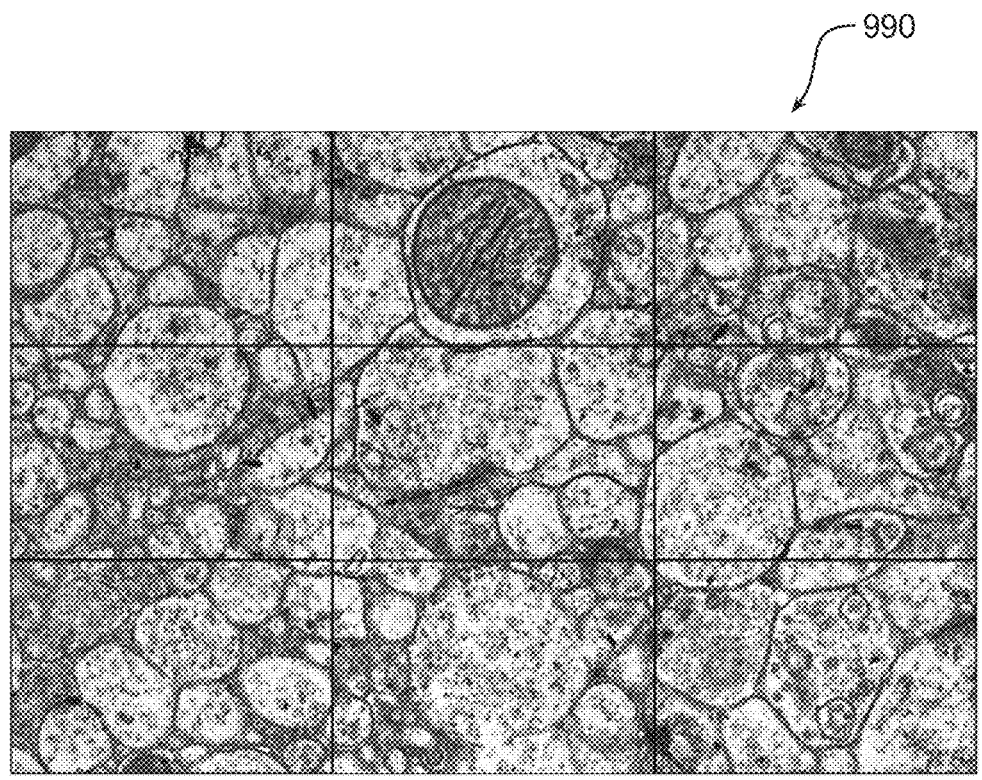

FIG. 15A is an illustration of an example of scanning of a nine-field supertile 990 by electron beam 150 as part of combination stage-beam rastering. Electron beam 150 is sequentially scanned to each of the nine fields of view, where the field of a cortical tissue section is imaged. FIG. 15B shows the imaged nine-field supertile 990 of cortical tissue section that is obtained at a single stage position.

In the example described above, the supertile contains nine fields of view. However, other embodiments are possible. For example, a supertile could encompass four fields of view, wherein the electron beam is scanned clockwise, counterclockwise, or in another pattern from one field of view to the next within the supertile.

In a TEM or scanning microscope (e.g., STEM or SEM), the precise scan paths may be defined according to the particular application. For example, the location of the beam probe or field of view can be set to any position, for any time duration, along the scan path.

In one version, as a new image is being acquired, the controller aligns or otherwise conforms the new image to one or more previously generated images. For example, the controller may process newly detected pixel data to decide on or alter future imaging locations, such as to fill in gaps in imaging or to try to align the new image vertically or horizontally with one or more of the previously generated images. In another example, the controller processes newly detected pixel data to decide on or alter future image resolution or time spent at a particular location. For example, the controller may estimate a likely significance of the image at a predetermined location, and the controller may use that estimate to increase or decrease resolution or another image quality parameter for imaging at that location or nearby. These adjustments can alternatively or additionally be calculated between imaging cycles to affect the next new cycle of image acquisition.

In one embodiment, the controller controls the stage and/or beam scanners to move the beam or probe relative to the sample in a stochastic, path-dependent, or self-correcting fashion. This may be especially advantageous for electron beam microscopy due to the relatively fast response time of the electron beam to the scanning signal. For example, the controller may start creating an image by shifting the electron beam a small amount using a selected one of the beam scanners. The controller may then measure the magnitude of the shift actually produced, and use that measurement to change the amount and direction of the next shift. After more shifts and measurements have been performed, the controller may learn the strength, direction, and repeatability of the beam scanners and/or the stage. The controller may then use this learned information to produce substantially orthogonal or otherwise intentionally directed shifts at a suitable distance for stitching a larger image together. Furthermore, the controller may use the early images, although not acquired using optimal shifts, to prepare the stitched images, such that the time spent characterizing the shifts is not wasted.

Although performing these steps while images are acquired live is possible and may be a preferred operating mode, the analysis may also be performed off-line. Although it may not be possible to optimize shifts for the previously acquired image after it has occurred, that image may provide useful information for future image acquisitions, or may provide more complete information about a sample or operating instabilities when processed altogether, or may further provide information about time dependent events in a sample, such as how a sample evolves in time in a reactive environment.

As another example, as an image is tiled, areas of low or zero contrast may be identified. When images from that region are next imaged, the imaging system could spend less time on that area, or measure it at a lower resolution. This could be done at a faster rate than when acquiring normal quality images and lead to a speed up in total image acquisition time, while not affecting the quality of the image in the important areas. Lower quality images can be checked to insure that they really do represent a low-interest region, and if it is determined they do not, the image could be reacquired at higher or regular resolution.

The controller may also be adapted to increase the quality of the image at or near a feature of interest, and decrease the quality of the image (while increasing imaging speed) with increasing distance from that feature of interest.

The controller may also control the stage and/or beam scanners to produce alternative scanning patterns. For example, the controller may scan the beam or probe across the sample in space-filling curve patterns. Space-filling curves may include, for example, a Hilbert curve, Peano curve, or another suitable type of progressively finer scanning curve. These scans can achieve progressively finer detail over time, such as by incrementally increasing the order of the curve, allowing users to decide whether to continue scan based on coarser, earlier data.

The above methods could be applied in real-time to data as it is acquired and shown to the user immediately. The user could then cancel the acquisition if needed or manually highlight areas of interest that could be acquired at higher quality.

In one version, microscope 10 may generate at least two types of images of sample 20. The first category is survey images, which may be taken to generate a high-framerate survey video. These survey images may be used for tuning the microscope, and finding the appropriate area of the sample on which to conduct more detailed imaging. The second category is high-resolution images. When imaging in the high-resolution mode, the microscope may be slower and less responsive than in the survey mode, but can provide more detail and less noise than the survey images, or signals that may be unavailable at high framerates (e.g., x-ray composition data).

In one embodiment, microscope 10 performs a preliminary, lower-resolution imaging of sample 20 before a principal, higher-resolution imaging of sample 20. The preliminary imaging may be, for example, a faster or lower-dose scan of sample 20 used to determine the locations of one or more features of interest in sample 20. These features may include, for example, a specific cell body with a tag that sets it apart from other cell bodies, or each of multiple polymer strands. This scan may, in one embodiment, cover a substantially contiguous area, rather than being limited to particular and discrete scanning areas. Surveying may also be performed outside of microscope 10, where fiducials on sample 20 or another registration mechanism is provided, such as using a different type of charged-particle microscope or alternatively an optical microscope (such as for fluorescent or light-visible tags).

The controller may then define the scanning areas such that the scanning areas track sample 20 based on the determined location of sample 20. By defining scanning areas that track sample 20, microscope 10 may be able to avoid even more empty area where areas of interest of the sample are not present, eliminating wasteful acquisition of pixels and providing effectively faster imaging speeds. Using the scanning areas, the controller may perform a slower or higher-resolution scan within the scanning areas, thus concentrating the imaging on the actual location of sample 20 and thereby improving efficiency. For example, within each scanning area microscope 10 may raster scan the beam or probe.

Data streamed from microscope 10 by the UI may be adjusted dynamically and automatically such that the user experience is enhanced based on the UI context. For example, microscope 10 may be configured to automatically transition between data densities and latencies based on input from the user to provide an improved user experience. Further, microscope 10 may be configured to predictively acquire and cache image data to be served on a contextual basis to the client UI. While adjustment of datastream mode and latency can be applied to serially-acquired data as well, the above description also applies data acquired through parallel means, such as from a CCD camera.

It is typically desirable to have the image that is produced by the imaging system accurately represent information in the sample needed for analysis. In the ideal case of perfect imaging, the image faithfully reproduces the features of the sample that are needed for analysis. In the real world, however, imaging is often imperfect. In some cases, distortions due to imperfect imaging conditions can result in a warped image. In beam-optical microscopes, these distortions may be caused, for example, by instabilities in the environment such as stray electric or magnetic fields, mechanical vibrations, temperature fluctuations, or internal instabilities such as power supply ripple, ground noise, or periodic electrical discharges.

In a beam-optical microscope, the controller may be adapted to automatically diagnose the magnitudes of various aberrations and apply compensating signals to the optical system, such as to one or more of the optical elements that may cause aberrations and/or the aberration corrector (e.g., aberration corrector 90). Microscope 10 may be especially adapted to correct for two types of image distortions: (1) distortions that are periodic in time, and (2) distortions that are static in time. An example of the first type involves displacement of the beam-probe location due to mains AC fields.

One exemplary method is to raster scan one or more tuning regions of sample 20 to generate an image and to analyze the generated image to extract information about aberrations that can be used to correct the aberrations. The tuning regions may be of any shape or size and may be located within or outside of the areas to be scanned.

Distortions can be diagnosed by analyzing images of the same sample taken using different scan parameters. Based on the types of distortions to correct, more images may be generated that have different rotations, sampling frequency, sampling spacing, magnification, etc. Periodic and static distortions can be extracted from some or all of the above comparisons, based on assumptions about the distortions.

For example, in a conventionally rastered image, wherein the fast "x" direction represents the pixel scan that increments each pixel clock, and the slow "y" direction represents the line scan that increments only after a full pixel width of the field of view is acquired, an image can be recorded with the fast, "x" direction, then another image of the same sample can be acquired in a direction that is rotated by approximately 90 degrees in relation to the previous "x" direction. By comparing the location of features between the two images of the same sample, a map of distortion can be calculated across either image.

Once distortions are measured the data can be presented to the user as a measure to help diagnose instabilities. It could also be used as input to a post processing algorithm to remove distortions. This algorithm could be applied to future images assuming the distortions remain constant. It could also be used and fed back in to the scanning unit to correct for the distortions by changing the scanning locations (e.g., moving the beam to a location where adding the measured distortion will place the beam at the required location). Following the application of any of these or other correcting techniques, the process could be applied again iteratively, each time measuring and potentially correcting finer distortions.

A sample used for the purposes of diagnosing aberrations in a charged-particle beam microscope may contain, for example, single atoms or clusters of atoms, or may be another kind of sample adapted to permit microscope 10 to diagnose optical aberrations. For example, the sample may be the same sample 20 that is also the subject of interest for study. Alternatively, the sample may be a reference sample used solely for calibration of microscope 10. Distortions relative to the known structure of the reference sample can then be extracted.

The tuning region may be positioned to account for workflow convenience. For example, the tuning region may be located at a default (or "home") position of stage 40 so that it may be used to tune microscope 10 prior to imaging sample 20 and the user can always be presented with a substantially optimized image of sample 20.

An identification pattern may be created on a sample stick 410 temporarily or permanently. For example, the identification pattern may be a removable sample label that is placed on sample stick 410, or patterned onto sample stick 410 using an electron beam of microscope 10 adjusted with elevated current. The patterning could be carried out on a beam-sensitive label area of sample stick 410, comprising, for example, a beam-sensitive sacrificial polymer, or an etchable substrate catalyzed by exposure to a beam. Alternatively, the identification pattern may be etched onto sample stick 410. The identification pattern may contain a unique identification code that can be determined when the pattern is read by one or more means. For example, the pattern may comprise a miniature bar code, QR code, or another type of code based on a geometric pattern. The pattern may be visible to photons and/or charged particles. The identification code may be inserted into the metadata of images of the sample(s) on that sample stick 410 that are generated by the microscope, providing convenient tracking of the sample(s).

A reference pattern may also be placed on a sample stick 410 to enable quick calibration of microscope 10, such as focusing, rotation calibrations, and magnification calibrations, by imaging of the reference pattern. For example, microscope 10 may perform this calibration substantially automatically. The reference pattern may be placed at a location of a sample stick 410 that is predetermined. The same reference pattern may be used on different sample sticks 410 to enable microscope 10 to be calibrated by imaging the reference pattern.

Furthermore, a combination identification/reference pattern may be provided in which the pattern provides an identification code and the same pattern is also used for calibration of the microscope. In this version, microscope 10 may, on insertion of a sample stick 410, read the identification code from the pattern and simultaneously calibrate microscope 10 based on the pattern, readying microscope 10 for imaging of the sample.

As a charged-particle beam microscope is operated, various parameters may vary undesirably over time. This may conventionally necessitate vigilance and maintenance by the user. For example, the user may have to monitor the parameters and, for example, instruct the controller to turn off the charged-particle beam source if a particular value falls below a predefined threshold. This may increase the burden on the user and negatively impact ease of use of the microscope.

To address this, the controller may automatically monitor important operating parameters. The controller may also automatically make changes to keep the parameters within suitable ranges. Alternatively, the controller may make these changes at times that are appropriate or convenient to the user, such as between imaging cycles.

In one example of charged-particle beam microscopy, the controller monitors the emission current to maintain desired operating conditions of microscope 10. The controller can change the emission current by varying the voltage at the Wehnelt. However, doing so while imaging may cause detrimental effects in the images. Therefore, the controller may vary the voltage at the Wehnelt to make these adjustments at times that imaging is not occurring.

In another example of charged-particle beam microscopy, the controller may monitor the filament temperature, resistance, and/or current and adjust the power supply accordingly to keep these values within predefined (e.g., user-defined) ranges. The controller may optionally make these adjustments only at appropriate times, such as when image acquisition is not occurring.

Thus, by automatically monitoring and correcting those parameters, microscope 10 may substantially avoid the need for human intervention in regard to those parameters and therefore even be able to hide the existence of those parameters from the user. This can make operation of microscope 10 much simpler and easier for the user, who can in turn focus on his or her ultimate desired use of microscope 10.

The controller may also evaluate information originating at one or more of the detectors of a beam-optical microscope, either between imaging cycles or simultaneous with imaging, to determine the current quality of imaging. In one version, imaging information from dedicated "tuning regions" is used. However, the images themselves may additionally or alternatively be used. For example, information from the most recent images can be used to determine trends of tuning deterioration. This evaluation can be used to set parameters of microscope 10 to improve the quality of imaging. For example, referring to FIG. 1 for the sake of illustration, the parameters may be applied to condenser lenses (e.g., condenser lenses 70A-C), the objective lens (e.g., objective lens 100), the aberration corrector (e.g., aberration corrector 90), and the stage (e.g., stage 15). In an illustrative example, the parameters applied to the condenser lenses, the objective lens, and the stage may improve the focus, while the parameters applied to the aberration corrector may compensate for higher orders of aberration. This process may be referred to as "re-tuning" the microscope.

It may be desirable to maintain the microscope in a substantially steady state in terms of contamination and stability during imaging. But the performance of the optical system of a charged-particle beam microscope may tend to deteriorate over time. In one example, the optical system of a charged-particle beam microscope may deteriorate to an undesirable state in from about 5 to about 30 minutes, such as about 15 minutes. When this happens, it may become advantageous to perform re-tuning. In one version, first-order and second-order aberrations may be especially prone to deterioration and/or advantageous to compensate for by re-tuning. The charged-particle beam source may also deteriorate over time. To refresh the charged-particle beam source, it can be "flashed" by running a high current through it between beam scanning cycles. This causes a localized heating of the filament that reconditions the source.

Re-tuning of a charged-particle beam microscope may be triggered according to any suitable procedure. The controller may monitor the microscope to initiate the determination of imaging quality, the controller may automatically initiate re-tuning at regular intervals, or the controller may poll a store of recently generated images to determine image quality as a background process. For example, the re-tuning may be triggered within any desired time interval, such as within any quantity of hours or minutes, or subsequent to any quantity of images generated by the microscope or every Nth linear scan or scan cycle performed by the microscope. In an exemplary embodiment, the controller initiates re-tuning between sequential fields of view. In another embodiment, however, the controller can re-tune the optical system between sequential scanning areas.

At each of the sub-areas, microscope 10 may image a tuning region within or outside of the sub-area one or more times to generate one or more sub-images that can be used to track the sample and/or produce imaging metadata. The imaging metadata may include, for example, focus error and amounts of various orders of aberration, and beam current. The controller may use the imaging metadata to modify parameters to improve image quality, such as, for example, to autofocus the image at the elevation of sub-area. For example, the controller may evaluate several sub-images taken in a particular area to determine the magnitude and direction of focus error. Using this information, microscope 10 can generate a final well-focused sub-image that will be used for evaluation of the sample itself. Microscope 10 may use any number of sub-images of a sample to determine imaging metadata. The sub-images may cover any desired variation range for a particular parameter.

In analyzing an image, the controller may analyze any suitable characteristics of the image, such as intensity, pixel counts, or power, each of which may be analyzed in real space or in frequency space (so that intensity may be within or outside of a spatial frequency range). When comparing images or evaluating a series of images, the controller may utilize any suitable characteristic that differs between the images, such as in a preselected region of the images.

The controller may also use any number of images for the image quality comparison, where the image quality values for current and prior images may be combined in any suitable fashion, such as averaged, weighted, or summed. A user threshold for image quality may be set to any suitable value. A comparison of image quality values may utilize any mathematical or statistical operations to determine image quality compliance, such as a comparison, statistical variance, or deviation.

The imaging process may be performed automatically, such as after initiation by a user or initiation by a larger process of which the imaging is a subprocess. Parameters may be determined automatically and applied to the microscope. Alternatively, any part of the technique, such as image generation, determination of parameters, or application of the parameters, may be performed manually. For example, the controller or a separate computer system may provide the optimal settings to a technician who manually applies the settings to the microscope. The microscope controller may perform any desired processing, such as monitoring and adjustment of optical parameters or image formation and processing. For example, the controller may align images using image registration algorithms. The controller of a beam-optical microscope may also adjust the aberrations and defocus of an image based on characteristics of a previous image.

The apparatuses described herein may be used in any suitable facility in any desired arrangement, such as networked, direct, or indirect communication arrangements. Moreover, the various functions of the apparatuses may be distributed in any manner among any quantity of components, such as one or more hardware and/or software modules or units. The hardware may include microscopes, machine managers, computer or processing systems, circuitry, networks, and image stores, that may be disposed locally or remotely of each other and may communicate with each other or be coupled to each other in any suitable manner, such as wired or wireless, over a network such as WAN, LAN, Intranet, Internet, hardwire, or modem, directly or indirectly, locally or remotely from each other, via any communications medium, and utilizing any suitable communication protocol or standard. The software and/or algorithms described above may be modified in any manner that accomplishes the functions described herein.

The charged-particle beam microscopes described herein may be implemented with either electrostatic or magnetic components or a combination thereof. For example, the electron beam microscopes may include any quantity of electrostatic, electromagnetic, or magnetic components, such as an electron or other charged-particle gun, lenses, a dispersion device, stigmators, deflectors, detectors, and stages, arranged within or outside of the microscope in any suitable fashion.

Image stores, files, and folders used by the apparatuses may be of any quantity and may be implemented by any storage devices, such as memory, database, or data structures. Implementation of aspects of the microscope, such as image processing or the user interface, may be distributed among the controller or other processing devices in any desired manner, where these devices may be local or remote in relation to one another. Furthermore, functionality of the controller may be implemented in hardware, software, or any suitable combination of hardware and software. The controller may communicate with and/or control the microscope to perform any desired functions, such as scanning the sample and generating the images or transferring images to memory.

Although the foregoing embodiments have been described in detail by way of illustration and example for purposes of clarity of understanding, it will be readily apparent to those of ordinary skill in the art in light of the description herein that certain changes and modifications may be made thereto without departing from the spirit or scope of the appended claims. It is also to be understood that the terminology used herein is for the purpose of describing particular aspects only, and is not intended to be limiting, since the scope of the present invention will be limited only by the appended claims.

It is noted that, as used herein and in the appended claims, the singular forms "a", "an", and "the" include plural referents unless the context clearly dictates otherwise. It is further noted that the claims may be drafted to exclude any optional element. As such, this statement is intended to serve as antecedent basis for use of such exclusive terminology as "solely," "only," and the like in connection with the recitation of claim elements, or use of a "negative" limitation. As will be apparent to those of ordinary skill in the art upon reading this disclosure, each of the individual aspects described and illustrated herein has discrete components and features which may be readily separated from or combined with the features of any of the other several aspects without departing from the scope or spirit of the disclosure. Any recited method can be carried out in the order of events recited or in any other order which is logically possible. Accordingly, the preceding merely provides illustrative examples. It will be appreciated that those of ordinary skill in the art will be able to devise various arrangements which, although not explicitly described or shown herein, embody the principles of the disclosure and are included within its spirit and scope.

Furthermore, all examples and conditional language recited herein are principally intended to aid the reader in understanding the principles of the invention and the concepts contributed by the inventors to furthering the art, and are to be construed without limitation to such specifically recited examples and conditions. Moreover, all statements herein reciting principles and aspects of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure. The scope of the present invention, therefore, is not intended to be limited to the exemplary configurations shown and described herein.

In this specification, various preferred embodiments have been described with reference to the accompanying drawings. It will be apparent, however, that various other modifications and changes may be made thereto and additional embodiments may be implemented without departing from the broader scope of the claims that follow. The specification and drawings are accordingly to be regarded in an illustrative rather than restrictive sense.

I claim:

1. An apparatus for microscopy, inspection, or analysis of a sample, the apparatus comprising:
   a vacuum chamber;
   a charged-particle beam column in the vacuum chamber to direct a charged-particle beam onto a sample, the charged-particle beam column comprising:
      a charged-particle beam source to generate a charged-particle beam, and
      charged-particle beam optics to direct the charged-particle beam onto the sample, the charged-particle beam optics comprising an objective lens,
   a detector to detect radiation emanating from the sample to generate an image;
   a removable cartridge to support the sample in the path of the charged-particle beam and move the sample in one or more dimensions in the vacuum chamber, the cartridge being adapted to be separately removed from and inserted into the vacuum chamber by holding the cartridge at one or more contact surfaces of the cartridge and moving the cartridge through an opening of the vacuum chamber;
   an anchor to hold the cartridge inside the vacuum chamber, the anchor being configured to hold the cartridge substantially by frictional force, the cartridge not being rigidly physically connected to anything that is external to the vacuum chamber; and
   a controller to analyze the detected radiation to generate an image of the sample.

2. An apparatus according to claim 1, wherein the anchor is configured to have substantial positional stability in relation to the objective lens.

3. An apparatus according to claim 1, wherein the cartridge comprises one or more actuators to move the sample in one or more dimensions.

4. An apparatus according to claim 3, wherein the actuators are adapted to impart motions to the sample by movements of the actuators that less than or equal to two orders of magnitude as compared to the movements of the sample.

5. An apparatus according to claim 1, wherein the cartridge comprises one or more actuators to tilt the sample in one or more axes.

6. An apparatus according to claim 1, wherein the cartridge comprises one or more actuators that comprise piezoelectric motors.

7. An apparatus according to claim 1, wherein the cartridge comprises one or more actuators that comprise voice coils.

8. An apparatus according to claim 1, wherein the cartridge is smaller than 10 cm×10 cm×10 cm.

9. An apparatus according to claim 1, wherein the cartridge is communicatively coupled to the external environment for signal transmission and/or reception.

10. An apparatus according to claim 1, wherein the cartridge is communicatively coupled to the external environment by fine and flexible electrical wires for signal transmission and/or reception.

11. An apparatus according to claim 1, wherein the cartridge is adapted to hold a sample stick that supports the sample alone or as part of a plurality of samples.

12. An apparatus according to claim 1, further comprising an airlock to permit removal of the cartridge from the vacuum chamber and insertion of the cartridge into the vacuum chamber without necessitating venting of the vacuum chamber.

13. An apparatus according to claim 12, further comprising a transfer arm to transfer the cartridge between the airlock and the vacuum chamber and/or between the external environment and the airlock.

14. An apparatus according to claim 1, further comprising an automated sample-feeder to deliver samples to and/or remove samples from the interior of the vacuum chamber.

15. An apparatus according to claim 1, further comprising a magazine adapted to store a plurality of sample sticks, each sample stick supporting one or more samples.

16. An apparatus according to claim 1, further comprising an anchor to support the cartridge inside the vacuum chamber, the anchor not being rigidly physically connected to anything that is external to the vacuum chamber.

17. An apparatus for microscopy, inspection, or analysis of a sample, the apparatus comprising:
   a vacuum chamber;
   an airlock adapted to permit a removal and insertion of a sample into the vacuum chamber without necessitating venting of the vacuum chamber;
   a charged-particle beam column in the vacuum chamber to direct a charged-particle beam onto the sample, the charged-particle beam column comprising:
      a charged-particle beam source to generate a charged-particle beam, and
      charged-particle beam optics to direct the charged-particle beam onto the sample,
   a detector to detect radiation emanating from the sample to generate an image;
   a cartridge to support the sample in the path of the charged-particle beam in the vacuum chamber and move the sample in one or more dimensions, the cartridge not being rigidly physically connected to anything that is external to the vacuum chamber;
   an anchor to hold the cartridge, the anchor being configured to hold the cartridge substantially by frictional force; and
   a controller to analyze the detected radiation to generate an image of the sample.

18. An apparatus according to claim 17, further comprising a transfer arm to transfer the sample or the cartridge between the airlock and the vacuum chamber, and/or between the environment external to the vacuum chamber and the airlock.

19. An apparatus for microscopy, inspection, or analysis of a sample, the apparatus comprising:
   a vacuum chamber;
   a charged-particle beam column in the vacuum chamber to direct a charged-particle beam onto a sample, the charged-particle beam column comprising:
      a charged-particle beam source to generate a charged-particle beam, and
      charged-particle beam optics to direct the charged-particle beam onto the sample,
   a detector to detect radiation emanating from the sample to generate an image;
   a magazine adapted to store a plurality of sample sticks, each sample stick supporting a plurality of discrete samples;

a cartridge to support one of the sample sticks in the path of the charged-particle beam in the vacuum chamber and move the sample stick in one or more dimensions, the cartridge not being rigidly physically connected to anything that is external to the vacuum chamber; and a controller to analyze the detected radiation to generate an image of the sample.

20. An apparatus according to claim 19, further comprising a transfer arm to transfer the sample sticks between the magazine and the cartridge.

21. An apparatus for microscopy, inspection, or analysis of a sample, the apparatus comprising:

a vacuum chamber;

a charged-particle beam column in the vacuum chamber to direct a charged-particle beam onto a sample, the charged-particle beam column comprising:

a charged-particle beam source to generate a charged-particle beam, and charged-particle beam optics to direct the charged-particle beam onto the sample, the charged-particle beam optics comprising an objective lens, a detector to detect radiation emanating from the sample to generate an image;

a removable cartridge to support the sample in the path of the charged-particle beam and move the sample in one or more dimensions in the vacuum chamber, the cartridge being adapted to be separately removed from and inserted into the vacuum chamber by holding the cartridge at one or more contact surfaces of the cartridge and moving the cartridge through an opening of the vacuum chamber;

an anchor to hold the cartridge inside the vacuum chamber, the anchor being configured to have substantial positional stability in relation to the objective lens, the cartridge not being rigidly physically connected to anything that is external to the vacuum chamber; and a controller to analyze the detected radiation to generate an image of the sample.

22. An apparatus according to claim 21, wherein the anchor is substantially decoupled from the environment external to the vacuum chamber.

* * * * *